United States Patent [19]
Tanaka et al.

[11] Patent Number: 6,060,333
[45] Date of Patent: May 9, 2000

[54] METHOD OF MAKING A LIQUID CRYSTAL DISPLAY INCLUDING A FIELD EFFECT TRANSISTOR

[75] Inventors: Toshihiko Tanaka; Syuji Doi, both of Takatsuki; Hiroshi Koezuka, Amagasaki; Akira Tsumura, Amagasaki; Hiroyuki Fuchigami, Amagasaki, all of Japan

[73] Assignees: Mitsubishi Denki Kabushiki Kaisha, Tokyo; Sumitomo Chemical Company, Ltd., Osaka, both of Japan

[21] Appl. No.: 09/228,937

[22] Filed: Jan. 12, 1999

Related U.S. Application Data

[63] Continuation of application No. 08/835,634, Apr. 10, 1997, Pat. No. 5,892,244, which is a continuation of application No. 07/965,536, Oct. 23, 1992, abandoned, which is a continuation of application No. 07/576,437, Oct. 24, 1990, abandoned.

[30] Foreign Application Priority Data

Jan. 10, 1989 [JP] Japan ........................................ 1-4177
Jan. 10, 1990 [WO] WIPO ....................... PCT/JP90/00017

[51] Int. Cl.$^7$ .................................................. H01L 35/24
[52] U.S. Cl. ................................ 438/30; 438/23; 438/82; 438/99; 438/149; 438/151; 438/157
[58] Field of Search ................................. 438/23, 30, 82, 438/157, 99, 149, 151; 257/40, 72

[56] References Cited

U.S. PATENT DOCUMENTS

| | | | |
|---|---|---|---|
| 4,386,352 | 5/1983 | Nonomura et al. | 345/92 |
| 4,808,681 | 2/1989 | Harper et al. | 526/270 |
| 4,862,234 | 8/1989 | Koden | 357/23.7 |

(List continued on next page.)

FOREIGN PATENT DOCUMENTS

| | | |
|---|---|---|
| 62-85467 | 4/1987 | Japan . |
| 63-14472 | 1/1988 | Japan . |
| 63-76378 | 4/1988 | Japan . |
| 1-259563 | 10/1989 | Japan . |
| 1-259564 | 10/1989 | Japan . |

OTHER PUBLICATIONS

Tsumura et al., "Polythiophene Field–Effect Transistor: Its Characteristics And Operation Mechanism", Synthetic Metals, vol. 25, 1988, pp. 11–23.

Reynolds, "Advances In The Chemistry Of Conducting Organic Polymers: A Review", Journal of Molecular Electronics, vol. 2, 1986, pp. 1–21.

Lieser et al., "Structure, Phase Transistions And Polymerizability Of Multilayers Of Some Diacetylene Monocarboxylic Acids", Thin Solid Films, vol. 68, 1980, pp. 77–90.

(List continued on next page.)

*Primary Examiner*—Carl Whitehead, Jr.
*Assistant Examiner*—Maria Guerrero
*Attorney, Agent, or Firm*—Leydig, Voit & Meyer, Ltd.

[57] ABSTRACT

A method of fabricating a liquid crystal display device including a field effect transistor includes forming a gate electrode on an electrically insulating substrate, the gate electrode being located in a transistor region of the substrate; forming an electrically insulating film on the substrate and covering the gate electrode; forming source and drain electrodes on the electrically insulating film on opposite sides of the gate electrode in the transistor region; forming a display electrode on the electrically insulating substrate in a display region of the substrate, adjacent the transistor region, the drain electrode being electrically connected to the display electrode; and forming, in the transistor region, a semiconductor film of a π-conjugated polymer on the source and drain electrodes and on the electrically insulating film between the source and drain electrodes in the transistor region; arranging a transparent plate, including a transparent electrode, opposite and spaced from the π-conjugated polymer film and the display electrode with the transparent electrode opposite the display electrode; and injecting a liquid crystal material between the transparent and display electrodes and between the transparent plate and the π-conjugated polymer film.

12 Claims, 13 Drawing Sheets

U.S. PATENT DOCUMENTS

| | | | |
|---|---|---|---|
| 4,868,284 | 9/1989 | Murase et al. | 528/481 |
| 4,873,556 | 10/1989 | Hyodo et al. | 357/8 |
| 4,900,782 | 2/1990 | Han et al. | 525/398 |
| 4,923,288 | 5/1990 | Allen et al. | 350/355 |
| 4,963,503 | 10/1990 | Aoki et al. | 438/27 |
| 5,107,308 | 4/1992 | Koezuka et al. | 357/8 |
| 5,357,357 | 10/1994 | Imazeki et al. | 428/1.31 |
| 5,500,537 | 3/1996 | Tsumura et al. | 257/40 |
| 5,626,796 | 5/1997 | Tsujimura et al. | 252/582 |

OTHER PUBLICATIONS

Kan et al., "Langmuir–Blodgett Film Metal/Insulator/Semiconductor Structures On Narrow Band Gap Semiconductors", Thin Solid Films, vol. 99, 1983, pp. 281–296.

Jen et al., "Highly–Conducting, Poly (2,5–Thienylene Vinylene) Prepared Via A Soluble Precursor Polymer", Journal of the Chemical Society, Chemical Communications, 1987, pp. 309–311.

Sze, "Semiconductor Devices Physics And Technology", John Wiley & Sons, 1985, pp. 1 and 38.

METHOD OF MAKING A LIQUID CRYSTAL DISPLAY INCLUDING A FIELD EFFECT TRANSISTOR

This disclosure is a continuation of patent application Ser. No. 08/835,634, filed on Apr. 10, 1997 now U.S. Pat. No. 5,892,244, which is a continuation of prior patent application Ser. No. 07/965,536 abandoned, filed on Oct. 23, 1992, which is a continuation of prior patent application Ser. No. 07/576,437 abandoned, filed on Oct. 24, 1990.

TECHNICAL FIELD

The present invention relates to a field effect transistor (referred to as an FET element hereinafter) using an organic semiconductor and a liquid crystal display apparatus using the same as a drive element.

BACKGROUND ART

Heretofore, it has been known that silicon or GaAs monocrystal is used as a semiconductor layer in an FET element, and it is put to practical use. However, a material used for the element is expensive and the process for manufacturing the element is very complicated. In addition, an area where the element can be built in is limited by a size of a wafer. For example, when an active drive element used in a wide screen liquid crystal display element is manufactured, there is a considerable restriction in costs and an area as far as the above wafer is used. Because of such restriction, as the FET element which is used as an drive element in the liquid crystal display element, a thin film transistor using amorphous silicon is put to practical use at the present. However, in the thin film transistor using amorphous silicon, it becomes more difficult to uniformly manufacture many elements on a plane surface at low costs as its display element area is increased. Thus, recently, it has been proposed that the FET element is manufactured using an organic semiconductor Among the organic semiconductor, those using π-conjugated polymer are especially remarked because it has high processability, which is a characteristic of a polymer material, and its area can be easily increased (Japanese Patent Laid Open Gazette No. 62-85224).

It is thought that the π-conjugated polymer, whose skeleton of a chemical structure is of a conjugate double bond or triple bond, has a band structure comprising a valence band, a conduction band and a forbidden band separating those bands, which are formed by overlapping of π-electron orbits. The forbidden band of the π-conjugated polymer is mostly within a range of 1 to 4 eV, which varies with a material. Therefore, the π-conjugated polymer itself shows electrical conductivity of an insulator or that close to it. However, it is described that a carrier carrying an electric charge is generated by removing an electron from the valence band (oxidation) by a chemical method, an electrochemical method, a physical method or the like or by implanting (referred to as doping hereinafter) an electron into the conduction band (reduction). As a result, it is possible to vary its electrical conductivity over a large range from an insulator region to a metal region by controlling an amount of doping. The π-conjugated polymer obtained by a doping of oxidation reaction is p type and it is n type in a doping of reduction reaction. This is similar to impurity addition to an inorganic semiconductor. Thus, it is possible to manufacture various semiconductor elements using the π-conjugated polymer as a semiconductor material.

As the FET element in which the π-conjugated polymer is used as a semiconductor, it is known that polyacetylene is used (J. Appl. Phys., Vol. 54, pp.3255, 1983). FIG. 15 is a sectional view showing a conventional FET element using polyacetylene. In this figure, reference numeral 1 designates a glass serving as a substrate, reference numeral 2 designates an aluminum film serving as a gate electrode, reference numeral 3 designates a polysiloxane film serving as an insulating film, reference numeral 4 designates a polyacetylene film serving as a semiconductor layer and reference numerals 5 and 6 designate gold films serving as a source electrode and a drain electrode, respectively.

Operation of the FET element in which polyacetylene is used as a semiconductor layer will be described. When a voltage is applied between the source electrode 5 and the drain electrode 6, a current flows between the source electrode 5 and the drain electrode 6 through the polyacethylene film 4. At this time, when a voltage is applied to the gate electrode 2 formed on the glass substrate 1 and separated from the polyacetylene film 4 by the insulating film 3, electrical conductivity of the polyacetylene film 4 can be varied by an electric field effect, so that the current between the source and drain can be controlled. The reason for this is thought that a width of a depletion layer in the polyacethylene film 4 adjacent to the insulating film 3 varies with the voltage applied to the gate electrode 2 and then a section area of a channel comprising an effective positive carrier accordingly varies. However, the current between the source and drain which can be varied with the gate voltage is considerably small in this FET element.

As another example of the FET element in which the π-conjugated polymer is used as a semiconductor, it is known that poly (N-methylpyrrole) (Chem. Lett., pp. 863, 1986) and polythiophene (Appl. Phys. Lett., Vol. 49, pp. 1210, 1986) are used. FIG. 16 shows a sectional view showing an FET element in which poly (N-methylpyrrole) or polythiophene is used as a semiconductor layer. In this figure, reference numeral 3 designates silicon oxide serving as the insulating film, reference numeral 4 designates a poly (N-methylpyrrole) film or polythiophene film serving as the semiconductor layer, reference numerals 5 and 6 designate gold films serving as the source electrode and the drain electrode, respectively, reference numeral 1 designates a silicon plate serving as the substrate and also the gate electrode and reference numeral 2 designates a metal for making ohmic contact with the silicon plate 7. When poly (N-methylpyrrole) is used as the semiconductor layer, a current (electrical conductivity) flowing between the source electrode 5 and the drain electrode 6 through the semiconductor layer 4 is only slightly controlled by a gate voltage and then there is no practical value therein.

On the other hand, when polythiophene is used as the semiconductor layer, the current (electrical conductivity) flowing between the source electrode 5 and the drain electrode 6 through the semiconductor layer 4 can be modulated 100 to 1000-fold by the gate voltage. However, since polythiophene is formed by electrochemical polymerization in the prior art, it is very difficult to uniformly manufacture many FET elements at the same time.

Thus, the current between the source and drain which can be modulated by the gate voltage is too small in the FET element in which polyacetylene or poly (N-methylpyrrole) is used as the semiconductor layer. In addition, although the current between the source and drain can be largely modulated by the gate voltage in the FET element in which polythiophene is used as the semiconductor layer and also has high stability, since the FET element is manufactured by means of forming a polythiophene film directly on the element substrate by the electrochemical polymerization, it is difficult to uniformly manufacture many FET elements on a large substrate at the same time in an element manufacturing process, which is a problem in the production process.

DISCLOSURE OF INVENTION

According to an FET element in accordance with the present invention, a π-conjugated polymer film serving as a semiconductor layer is formed by first forming a π-conjugated polymer precursor film using a π-conjugated polymer precursor which is soluble in a solvent, and then changing the precursor polymer film to the π-conjugated polymer film.

In addition, according to a liquid crystal display apparatus in accordance with the present invention, the above FET element is used as an active drive element therein.

According to the present invention, instead of directly forming the π-conjugated polymer film by a method such as electrochemical polymerization, the π-conjugated polymer precursor film is formed from the π-conjugated polymer precursor which is soluble in a solvent and then this precursor polymer film is changed to the π-conjugated polymer film. By using this π-conjugated polymer film as the semiconductor layer, the process for manufacturing the element becomes considerably simple. As a result, it is possible to manufacture many FET elements on a large area substrate at the same time and at low costs while it is possible to stably operate all of the manufactured FET elements and to largely modulate a current between the source and drain by a gate voltage.

In addition, when the above FET element is used as a drive element of the liquid crystal display apparatus, it is possible to easily increase its area and manufacture a liquid crystal display apparatus having high function at low costs.

In addition, according to an FET element in accordance with another invention, the π-conjugated polymer film serving as a semiconductor layer is formed by first forming a Langmuir-Blodgett (referred to as an LB hereinafter) film of a π-conjugated polymer precursor using the π-conjugated polymer precursor which is soluble in a solvent, and then changing this LB film of the precursor polymer to an LB film (although this LB film is an organic thin film, it is referred to as the LB film in a broad sense) of the π-conjugated polymer.

In addition, in a liquid crystal display apparatus in accordance with another invention, the above FET element is used as an active drive element therein.

According to another invention, the same effect as in the above invention can be obtained, so that the process for manufacturing the element becomes considerably simple and it is possible to manufacture many FET elements on a large area substrate at the same time and at low costs, while it is possible to stably operate all of the manufactured FET elements and to largely modulate a current between the source and drain by a gate voltage.

Furthermore, when the FET element manufactured as described above is used as a drive element of the liquid crystal display apparatus, the liquid crystal display apparatus easy in increasing its area and having high function can be provided at low costs.

According to still another invention, laminated films comprising a semiconductor layer formed of the π-conjugated polymer obtained from a precursor which is soluble in a solvent and an acid giving film which gives acid in a reaction in which the above π-conjugated polymer is obtained from the precursor which is soluble in the solvent are formed at a region sandwiched by the source electrode and the drain electrode. As a result, the π-conjugated polymer precursor film can be effectively changed to the π-conjugated polymer film and then a current between the source and drain can be largely modulated by a gate voltage.

BRIEF DESCRIPTION OF DRAWINGS

In addition, the same reference numerals in the figures designate the corresponding parts.

BEST MODE FOR CARRYING OUT THE INVENTION

Figure 1:
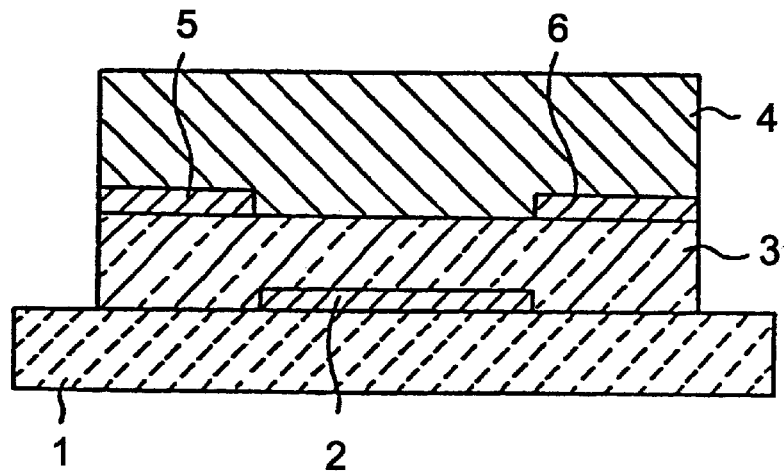
FIG. 1 is a sectional view showing an FET element in accordance with an embodiment of the present invention.

FIG. 1 is a view showing an example of an FET element in accordance with the present invention. In FIG. 1, reference numeral 1 designates a substrate, reference numeral 2 designates a gate electrode formed on the substrate 1, reference numeral 3 designates an insulating film, reference numeral 4 designates a π-conjugated polymer film or its LB film serving as a semiconductor layer and reference numerals 5 and 6 designate source and drain electrodes, respectively.

Figure 2:
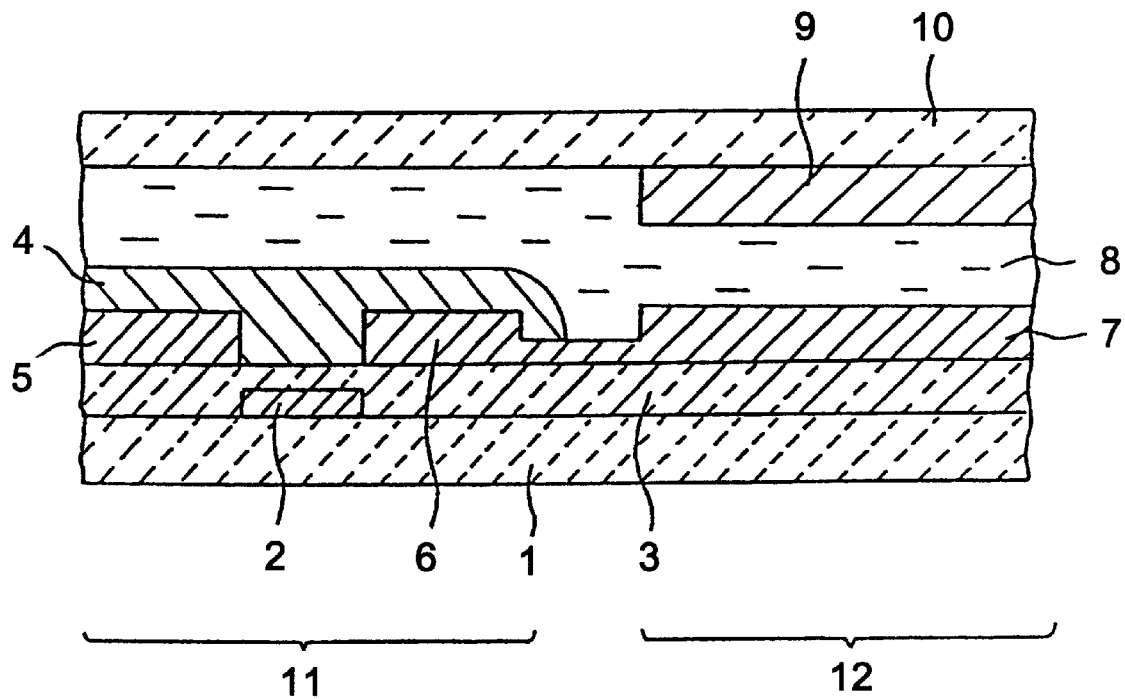
FIG. 2 is a sectional view showing a part corresponding to one pixel of a liquid crystal display apparatus in accordance with an embodiment of the present invention.

FIG. 2 is a sectional view showing an example of a liquid crystal display apparatus in accordance with the present invention. In FIG. 2, reference numeral 1 designates a substrate, reference numeral 2 designates a gate electrode formed on one side of the substrate 1, reference numeral 3 designates an insulating film formed on the substrate 1 and the gate electrode 2, reference numeral 5 designates a source electrode formed on the insulating film 3, reference numeral 6 designates a drain electrode formed also on the insulating film 3, which is isolated from the source electrode 5 and reference numeral 4 designates a semiconductor layer comprising a π-conjugated polymer or its LB film and formed on the insulating film 3, the source electrode 5 and the drain electrode 6 in contact with the source and drain electrodes 5 and 6, respectively, in which the above 2 to 6 constitute a part 11 of the FET element in the liquid crystal display apparatus. In addition, reference numeral 7 designates an electrode connected to the drain electrode 6 of the FET element 11, reference numeral 8 designates a liquid crystal layer, reference numeral 9 designates a transparent electrode and reference numeral 10 designates a glass plate having a polarizing plate. Processing for orientation is performed on the electrodes 7 and 9. The above 7 to 10 constitute a part 12 of the liquid crystal display in the liquid crystal display apparatus.

Materials used for the FET elements and the liquid crystal display apparatus in accordance with the present invention are as follows.

The substrate 1 can be formed of any insulating material. More specifically, it can be glass, an alumina sintered body or an insulating plastic such as polyimide film, polyester film, polyethylene film, polyphenylene sulfide film or polyparaxylene film. In addition, the substrate 1 is preferably transparent when it is used in the liquid crystal display apparatus.

As a material for the gate electrode 2, the source electrode 5 and the drain electrode 6, metal such as gold, platinum, chrome, palladium, aluminum, indium or molybudenum, low-resistance polysilicon, low-resistance amorphous silicon, tin oxide, indium oxide, indium tin oxide (ITO) or the like is used in general. However, it is a matter of course that its material is not limited to the above materials and two or more kinds of the above materials can be used together. In addition, as a method for providing the electrodes, deposition, sputtering, plating or several kinds of CVD growth methods are used. In addition, a conductive organic group low molecular compound or π-conjugated polymer can be used. In this case, an LB method can be also used.

In addition, p type silicon or n type silicon can be used as the gate electrode 2 and the substrate 1 in the liquid crystal display apparatus, in which the FET element shown in FIG. 1 or the FET element shown in FIG. 2 serve as a driving part, shown in FIG. 2. In this case, the substrate 1 can be dispensed with. In addition, in this case, although volume specific resistivity of p type silicon or n type silicon can be any value, it is preferably less than that of the π-conjugated polymer film 4 serving as the semiconductor layer in practice. In addition, a conductive plate or film such as a stainless plate or a copper plate can be used as the gate electrode 2 and the substrate 1 in accordance with a purpose of using the FET element.

In addition, the insulating film 3 can be formed of any organic or inorganic insulating material. In general, as a material for that, silicon oxide ($SiO_2$), silicon nitride, aluminum oxide, polyethylene, polyester, polyimide, polyphenylene sulfide, polyparaxylene, polyacrylonitrile, insulating LB films of several kinds or the like can be used. Of course, two or more kinds of the above materials can be used together. There is no limitation in a method for forming the insulating film. For example, a CVD method, a plasma CVD method, a plasmapolymerization method, a deposition method, a spin coating method, a dipping method, a cluster ion beam deposition method or an LB method can be used. In addition, when p type silicon or n type silicon are used as the gate electrode 2 and the substrate 1, silicon oxide film obtained by a method of thermal oxidation of silicon or the like is preferably used as the insulating film 3.

The electrode 7 of the FET element short-circuited with the drain 6 in the liquid crystal display part 12 in the liquid crystal display apparatus can be formed of any material which has sufficient electrical conductivity and is insoluble in the liquid crystal. For example, as their material, metal such as gold, platinum, chrome or aluminum, a transparent electrode such as tin oxide, indium oxide, indium tin oxide (ITO) or an organic polymer having electrical conductivity can be used. Of course, two or more kinds of the above materials can be used together. As a material for the electrode 9 on the glass plate 10, a transparent electrode such as tin oxide or indium tin oxide (ITO) is used in general. Alternatively, a conductive organic polymer having appropriate transparency can be used. In addition, two or more kinds of the above materials can be used together. However, the process for orientation such as diagonal deposition of $SiO_2$ or rubbing has to be performed on the electrodes 7 and 9. A liquid crystal such as a guest and host type liquid crystal, a TN type liquid crystal, or a smectic C phase liquid crystal may be-used for the liquid crystal layer 8. When glass is used as the substrate 1 and the transparent electrode is used as the electrode 7, a contrast ratio is increased by attaching a polarizing plate to the substrate 1. The polarizing plate of the glass plate 10 having the polarizing plate can be formed of any polarizing material.

In addition, as a material for the π-conjugated polymer film or the LB film 4 serving as the semiconductor layer, a material whose precursor of the π-conjugated polymer is soluble in a solvent can be used. Of course, two or more kinds of the materials can be used together. In addition, when the LB film of the precursor is formed, a material having an amphipathic property is preferably used. Among the materials whose precursor of the π-conjugated polymer is soluble in the solvent, especially the π-conjugated polymer represented by the following general formula (1), that is;

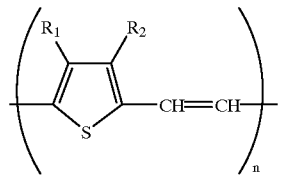

(1)

(where $R_1$ and $R_2$ are one kind of —H, an alkyl group, an alkoxyl group and n is an integer of 10 or more) is excellent in view of characteristics of the FET element. In addition, since the precursor of the π-conjugated polymer can be easily synthesized, the π-conjugated polymer in which the $R_1$ and $R_2$ are —H is preferably used. The above solvent can be organic solvents of several kinds, water or mixture thereof.

When the LB film of the precursor is formed, an organic solvent whose specific gravity is less than that of water and which is not likely to dissolve in water and is likely to evaporate is preferably used.

Then, a description will be given of the precursor of the π-conjugated polymer in which both $R_1$ and $R_2$ are —H in the above general formula (1). As the precursor of the π-conjugated polymer in which both $R_1$ and $R_2$ are —H in the above general formula (1), a material represented by the following general formula (2), that is;

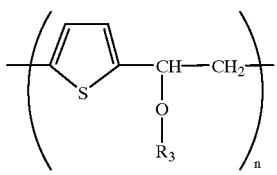 (2)

(where $R_3$ is a hydrocarbon group whose carbon number is 1 to 10) is preferably used in view of preservation stability. As the $R_3$ in the general formula (2), any hydrocarbon group whose carbon number is 1 to 10 can be used. For example, methyl, ethyl, propyl, isopropyl, n-butyl, 2-ethylhexyl or cyclohexyl group can be used. Among the above, hydrocarbon group whose carbon number is 1 to 6, especially methyl, or ethyl group is preferably used in practice. Although there is not any particular limitation in a method for synthesizing the polymer precursor, the polymer precursor obtained by a sulfonium salt decomposition method which will be described later is preferable in view of stability.

As a monomer when the general formula (2) is obtained by the sulfonium salt decomposition method, 2,5-thienylene dialkylsulfonium salt represented by the following general formula (3), that is;

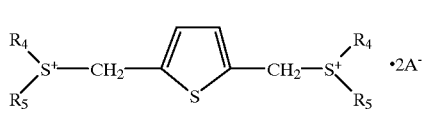 (3)

(where $R_4$ and $R_5$ are hydrocarbon group whose carbon number is 1 to 10 and $A^-$ is a counter ion) is used. As the $R_4$ and $R_5$ in the general formula (3), any hydrocarbon group whose carbon number is 1 to 10 can be used. For example, methyl, ethyl, propyl, isopropyl, n-buthyl, 2-ethylhexyl, cyclohexyl or benzil group can be used. Among the above, the hydrocarbon group whose carbon number is 1 to 6, especially, methyl or ethyl group is preferably used. Although there is no particular limitation in the counter ion $A^-$, for example halogen, hydroxyl group, boron tetrafluoride, perchloric acid, carboxylic acid, sulfonic acid ion can be used. Among the above, halogen such as chlorine or bromine or hydroxyl group ion are preferably used.

As a solvent used when condensation polymerization of the general formula (3) is performed to obtain the general formula (2), water, alcohol alone, or a mixed solvent containing water and/or alcohol is used. As a reaction solution used when the condensation polymerization is performed, an alkaline solution is preferably used. The alkaline solution is preferably a strong basic solution having pH 11 or more. As alkali to be used, sodium hydroxide, potassium hydroxide, calcium hydroxide, quaternary ammonium salt hydroxide, sulfonium salt hydroxide or strong basic ion exchange resin (OH type) or the like is used. Among them, especially, sodium hydroxide, potassium hydroxide or quaternary ammonium salt hydroxide or strong basic ion exchange resin is preferably used.

Since sulfonium salt is unstable under the conditions of heat, light, especially ultraviolet ray and strong basic, desulfonium-saltation gradually occurs after condensation polymerization, with the result that it is not effectively changed to alkoxyl group. Therefore, it is desirable that a condensation polymerization reaction is performed at relatively low temperature, more specifically, at °C. or less, especially 25° C. or less, or further −10° C. or less. Reaction time can be determined in accordance with a polymerization temperature and it is not particularly limited. However, it is usually within a range of 10 minutes to 50 hours.

According to the sulfonium salt decomposition method, after polymerization, the precursor of π-conjugated polymer is generated as a polymer electrolyte (polymer sulfonium salt) of high molecular weight having sulfonium salt, that is;

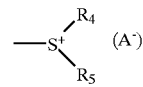 (A⁻)

at its side chain and the sulfonium salt side chain reacts with alcohol ($R_3OH$) in the solution and then alkoxyl group [corresponding to $OR_3$ in the formula (2)] of alcohol becomes the side chain. Therefore, the solvent to be used has to contain alcohol of the above $R_3OH$. The alcohol can be used alone or with another solvent. Although any solvent which is soluble in alcohol, can be used with alcohol, water is preferably used in practice. Although a mixture ratio of alcohol in the mixed solvent can be any value, alcohol with 5 or more percentage by weight is preferably used.

The sulfonium side chain can be effectively substituted for alkoxyl group if a reaction in which the sulfonium side chain is substituted for alkoxyl group is performed at a temperature higher than a condensation polymerization temperature in a solvent containing alcohol after the condensation polymerization. When the solvent of polymerization contains the above alcohol, the reaction of the substitution for alkoxyl group can be performed after the polymerization. On the other hand, when the solvent of polymerization does not contain the above alcohol, for example when it is water, the alcohol is mixed into it after the polymerization and then the same reaction can be performed. The reaction of substitution for alkoxyl group is preferably performed at a temperature 0° C. to 50° C. and more preferably 0° C. to 25° C. in view of reaction speed. Since a polymer having alkoxyl group at its side chain is insoluble in the mixed solvent in general, it is precipitated as the reaction proceeds. Therefore, the reaction is preferably continued until it is fully precipitated. Thus, a reaction time is preferably 15 minutes or more and more preferably, one hour or more in view of yield. Thus, the precursor of the π-conjugated polymer having alkoxyl group at its side chain is isolated by filtering the precipitate.

In order to obtain the precursor of the π-conjugated polymer having a high application property, molecular weight is preferably large enough and one having a repeat unit n of at least 10, more preferably 20 to 50000 of the π-conjugated polymer precursor of the general formula (2), for example, one having molecular weight of division molecular weight of 3500 or more which is not dialyzed by dialysis processing using a dialysis film is effectively used.

The precursor of the π-conjugated polymer shown in the general formula (2) having a leaving group such as alkoxyl group at its side chain has high solubility and soluble in many kinds of organic solvents. These organic solvents are, for example dimethylformamide, dimethylacetamide, dimethylsulfoxide, dioxane, chloroform or tetrahydrofuran.

When the LB film of the precursor is formed, an organic solvent having specific gravity less than that of water and not likely to dissolve in water and likely to evaporate is preferably used.

As a method for obtaining the precursor of the π-conjugated polymer used in the present invention, for example a spin coating method, a casting method, a dipping method, a bar coating method or a roll coating method utilizing the precursor of the π-conjugated polymer is dissolved in the solvent is used. Thereafter, the solvent evaporates and then a π-conjugated polymer precursor thin film is obtained. Then, the π-conjugated polymer precursor thin film is heated up, whereby the π-conjugated polymer film serving as a semiconductor can be obtained. Although there is not any particular heating condition when the π-conjugated polymer precursor thin film is heated up to be the π-conjugated polymer film, it is preferably heated up at 200° C. to 300° C. in an inert gas atmosphere in practice. Of course, the π-conjugated polymer precursor thin film can be changed to the π-conjugated polymer film even if it is heated up at 200° C. or less. In addition, when it is heated up in an inert gas atmosphere containing proton acid such as HCl or HBr, the π-conjugated polymer precursor thin film can be smoothly changed to the π-conjugated polymer film in most cases.

On the other hand, as a method for obtaining the LB film of the π-conjugated polymer precursor used in the present invention, there are LB methods including a vertical dipping method using Kuhn type trough, a horizontal attaching method and an LB film forming method using a moving wall type trough, using as a developer a π-conjugated polymer precursor solution dissolved in a solvent with pure water or an aqueous solution with salt or the like as a subphase. Thus, it is deposited on a substrate. Thereafter, water evaporates and then the dried LB film of the π-conjugated polymer precursor is obtained. Then, the LB film of the π-conjugated polymer precursor is heated up, whereby the LB film of the π-conjugated polymer serving as the semiconductor can be obtained. Although there is not any particular heating condition when the LB film of the π-conjugated polymer precursor is heated up to be the LB film of the π-conjugated polymer, it is preferably heated up at 200° C. to 300° C. in an inert gas atmosphere in practice. Of course, the LB film of the π-conjugated polymer precursor can be changed to the LB film of the π-conjugated polymer even if it is heated up at 200° C. or less. In addition, when it is heated up in an inert gas atmosphere containing proton acid such as HCl or HBr, the LB film of the π-conjugated polymer precursor can be smoothly changed to the LB film of the π-conjugated polymer in most cases.

In addition, when the LB film of the precursor is formed, even if the precursor of the π-conjugated polymer is soluble in a solvent, if it has not enough amphipathic property, a spreading solution mixed with a compound having a good amphipatic property such as stearic acid or arachidic acid is used for forming the LB film. Alternatively, the LB film can be formed in such a manner that the precursor of the π-conjugated polymer is adsorbed to a monomolecular film of the compound having a amphipatic property on the subphase.

As described above, according to the method for forming the π-conjugated polymer film, the π-conjugated polymer film or its LB film is not directly formed like a conventional electrochemical polymerization or the like but first, the polymer precursor film or its LB film is formed using the π-conjugated polymer precursor which is soluble in a solvent and then it is changed to the π-conjugated polymer film or its LB film. As a result, the π-conjugated polymer film or its LB film can be uniformly and easily formed on a substrate with a large area.

The π-conjugated polymer has low electric conductivity but has a nature of a semiconductor in general even if doping is not performed thereon. However, doping is often performed to improve characteristics of the FET element. As this doping method, there are chemical and physical methods (referring to "Industrial Material", Vol. 34, No. 4, pp.55, 1986). The former comprises (1) doping from a vapor phase, (2) doping from a liquid phase, (3) electrochemical doping, (4) light starting doping and the like and the latter comprises an ion implantation method. Any of them can be used.

Figure 3:
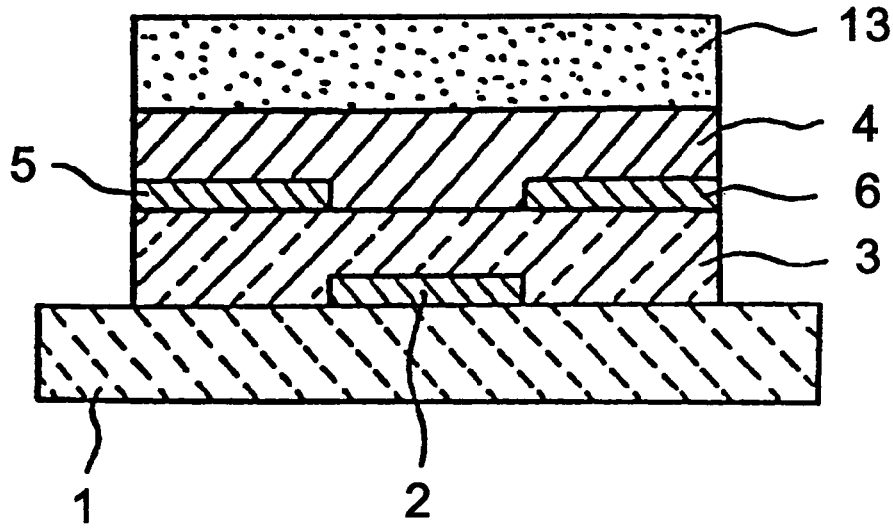
FIGS. 3 and 4 are sectional views each showing an FET element in accordance with another embodiment of the present invention.
Figure 4:
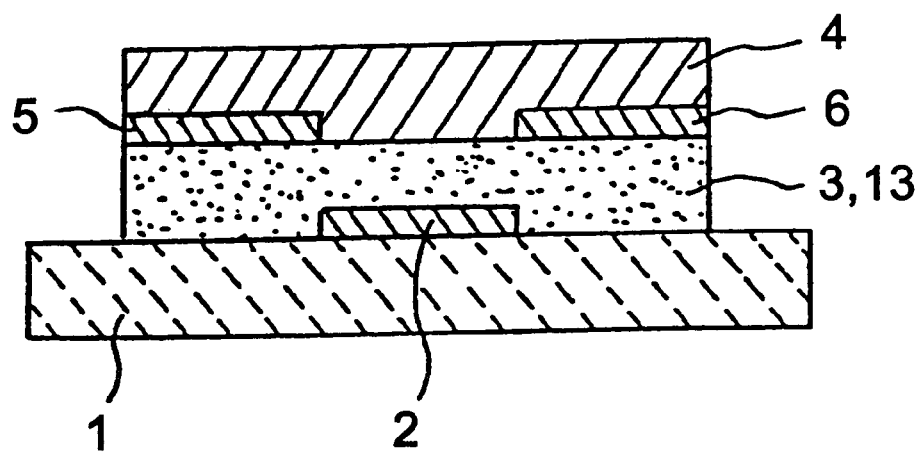

FIGS. 3 and 4 are sectional views each showing an FET element in accordance with another embodiment of the present invention. Reference numeral 13 designates an acid giving film for promoting changing reaction from the precursor film of the π-conjugated polymer 4 to the π-conjugated polymer film, which is formed on the π-conjugated polymer film 4 in FIG. 3 but formed on the substrate 1 and the gate electrode 2 in FIG. 4. In FIG. 3, even if positions of the π-conjugated polymer film 4 and the acid giving film 13 are exchanged, more specifically, even if the acid giving film 13 is formed on an insulating film 3, a source electrode 5 and a drain electrode 6 and then the π-conjugated polymer film is formed on the acid giving film 13, the completed FET element can control a current between the source and drain by applying a gate voltage.

Figure 5:
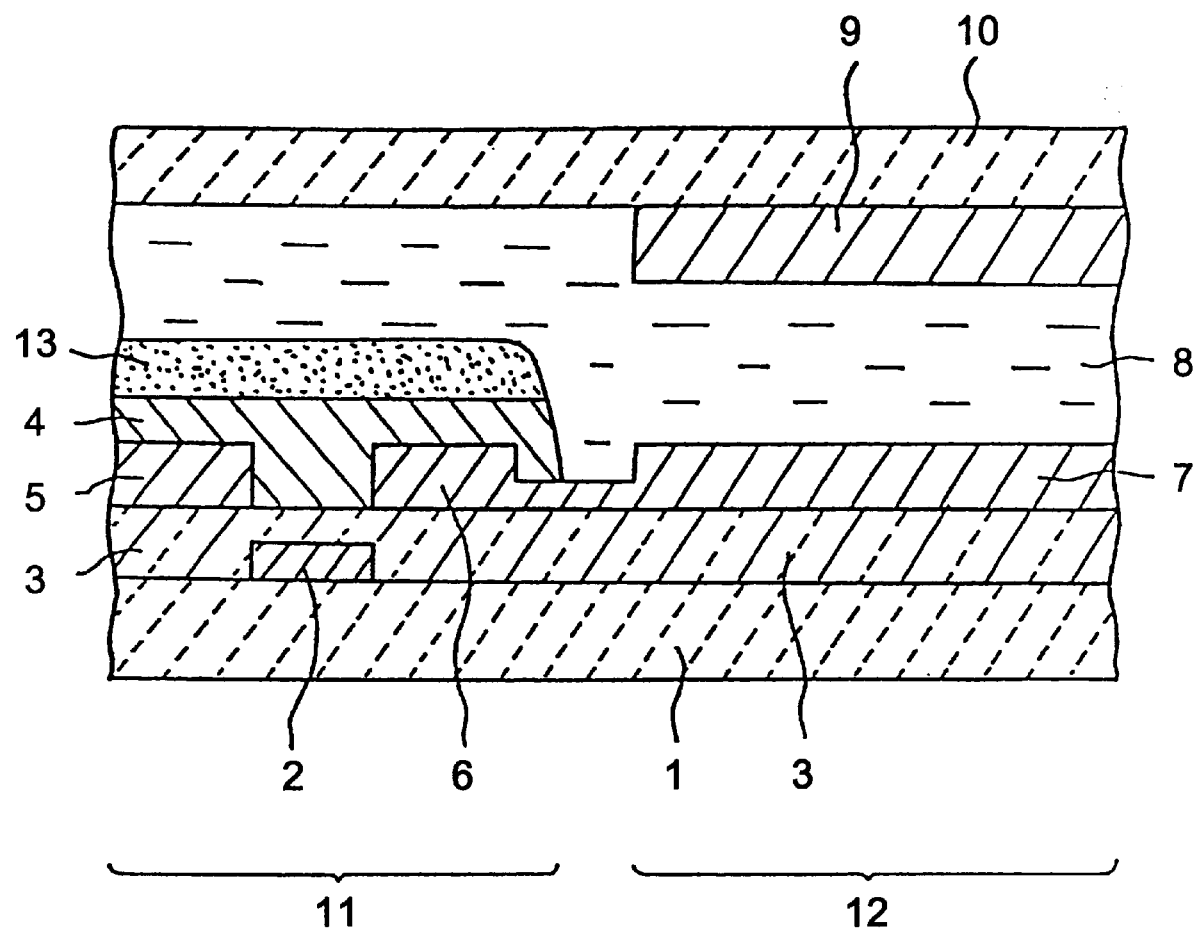
FIG. 5 is a sectional view showing a part corresponding to one pixel of a liquid crystal display apparatus in accordance with another embodiment of the present invention.

FIG. 5 is a sectional view showing a liquid crystal display apparat us in accordance with another embodiment of the present invention, in which reference numeral 13 designates an acid giving film for promoting a changing reaction from a precursor film of π-conjugated polymer 4 to a π-conjugated polymer, which is formed on the π-conjugated polymer film 4.

Other parts in FIGS. 3, 4 and 5 designate the same parts as in FIGS. 1 and 2 and methods for manufacturing them are also the same.

The acid giving layer 13 is a film which gives acid to promote the changing reaction from the precursor of the π-conjugated polymer to the π-conjugated polymer 4, which does not have any particular limitation.

However, the acid giving film itself is preferably an insulator in view of the characteristics of the FET element. For example, the following films are used, that is, an acid impregnated polymer film using polyimide film, polyester film, polyethylene film, polyphenylene sulfide film, polyparaxylene film or the like, the above polymer film containing an acid generating agent such as Lewis acid amine complex, tertiary amine class, Lewis acid diazonium salt, Lewis acid diallyliodonium salt or Lewis acid sulfonium salt, or film which easily eliminating acid by a reaction of p-xylylene-bis (sulfonium halogenide), its derivative or the like. As a method for obtaining the acid giving film, there is not any particular limitation therein. For example, a CVD method, a plasma CVD method, a plasma polymerization method, a deposition method, a cluster ion beam deposition method, an organic molecular beam epitaxial growth method, a spin coating method, a dipping method or an LB method can be all used.

As an example, a description will be given of a case where the π-conjugated polymer represented by the general formula (1) is used as the semiconductor layer and a π-conjugated polymer represented by the following general formula (4), that is;

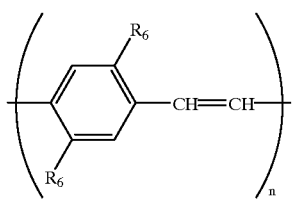

(4)

(where $R_6$ is one kind of —H, alkyl group, alkoxyl group and n is an integer of 10 or more) is used as the acid giving film. The general formula (4) has a π-conjugated polymer precursor represented by the following general formula (5), that is;

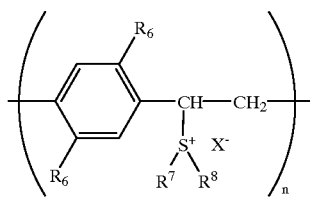

(5)

(where $R_6$ is one kind of —H, alkyl group, alkoxyl group, $R_7$ and $R_8$ are hydrocarbon group whose carbon number is 1 to 10, $X^-$ is halogen such as Br or Cl and n is an integer of 10 or more). The general formula (5) is soluble in water, and a film can be easily formed by the spin coating method, the casting method, the dipping method, the bar coating method, the roll coating method or the like. Therefore, as a method for forming laminated films comprising the π-conjugated polymer precursor thin film (the general formula (2)) serving as the semiconductor layer and the π-conjugated polymer precursor film (the general formula (5)) serving as the acid giving film, although there is not any particular limitation therein, it is preferable that the laminated films are formed by obtaining the π-conjugated polymer precursor film (the general formula (2)) serving as the semiconductor by the spin coating method, the casting method, the dipping method, the bar coating method, the roll coating method or the like using a solution of the π-conjugated polymer precursor dissolved in a solvent, evaporating the solvent, and then forming the acid giving film (the general formula (5)) by the same method as above in view of manufacture of the FET element. Alternatively, the laminated films may be formed by forming the acid giving film (the general formula (5)) as described above and then forming the π-conjugated polymer precursor film (the general formula (2)) serving as the semiconductor by the spin coating method, the casting method, the dipping method, the bar coating method, the roll coating method or the like using the solution of the π-conjugated polymer precursor dissolved in a solvent. Of course, the above laminated layers can be repetitively formed. Thereafter, the thus formed laminated films are heated up, whereby laminated layers of the π-conjugated polymer film (the general formula (1)) serving as the semiconductor and the insulating film (the general formula (4)) are formed. There is not any restriction in a heating condition when the laminated films comprising the π-conjugated polymer film (the general formula (1)) and the insulating film (the general formula (4)) are formed by heating up the laminated films comprising the π-conjugated polymer precursor thin film (the general formula (2)) and the acid giving film (the general formula (5)).

However, they are preferably heated up at a temperature 100° C. to 300° C. in an inert gas atmosphere in practice.

A description will be given of a method for giving acid when the π-conjugated precursor film (the general formula (5)) is used as the acid giving film. The π-conjugated polymer precursor film (the general formula (5)) serving as the acid giving layer is changed to the π-conjugated polymer (the general formula (4)) by heat. At this time, sulfonium

and acid (HX) are left. Then, the left acid is diffused into the π-conjugated polymer precursor film (the general formula (2)) serving as the semiconductor layer, whereby acid is given.

In addition, if the acid giving film is an insulator, the acid giving film can be also served as the gate insulating film in the FET element (FIG. 4). In this case, the process for manufacturing the FET element can be simplified.

Next, a description will be given of an operating mechanism of the thus formed FET element and the liquid crystal display apparatus in which the FET element serves as a drive element by describing an operation mechanism of a liquid crystal display apparatus.

Although the operating mechanism is still unknown in many respects, it is considered that a width of a depletion layer formed on the side of the π-conjugated polymer film 4 or its LB film is controlled by a voltage applied between the gate electrode 2 and the source electrode 5 at an interface between the π-conjugated polymer film or its LB film 4 and the insulating film 3 and then an effective channel section area of a carrier varies, with the result that a current flowing between the source electrode 5 and the drain electrode 6 varies. At this time, when the π-conjugated polymer film 4 or its LB film has a property of a p type semiconductor having low electrical conductivity, even if p type silicon, n type silicon or organic polymer having conductivity, which has high electrical conductivity is used as the gate electrode 2 other than a metal electrode, it is considered the depletion layer having a sufficiently large width is formed in the π-conjugated polymer film 4 or its LB film, whereby an electric field effect occurs.

According to the liquid crystal display apparatus in accordance with the present invention, the FET element part 11 is connected to the liquid crystal display part 12 in series. In a case where the π-conjugated polymer film or its LB film shows a property of the p type semiconductor, when a negative voltage is applied to a the gate electrode 2 while a negative voltage is applied to the transparent electrode 9 using the source electrode 5 as a reference, the liquid crystal 8 is turned on. As described above, the reason for this is considered that resistance between the source and drain electrodes of the FET element is decreased by applying the negative voltage to the gate electrode 2 and a voltage is applied to the liquid crystal display part 12. On the other hand, when the gate voltage is stopped while the negative voltage is applied to the transparent electrode 9 using the source electrode 5 as a reference, the liquid crystal 8 is not turned on. The reason for this is considered that the resistance between the source and drain electrodes of the FET element is increased so that a voltage is not applied to the liquid crystal display part 12. As described above, according to the liquid crystal display apparatus in accordance with the present invention, operation of the liquid crystal display part 12 can be controlled by varying the gate voltage applied to the attached FET element.

Although the gate electrode 2 is formed on the substrate 1 in FIG. 2, it is all right if the π-conjugated polymer film or its LB film is formed on the substrate, the source electrode and the drain electrode are separately formed thereon, then the insulating film is interposed between the source and drain electrodes and then the gate electrode is formed on the insulating film. Alternatively, it is also all right if the gate electrode is formed on the substrate, the insulating film is interposed between them, the π-conjugated polymer film or the LB film is formed thereon and then the source electrode and the drain electrode are separately formed thereon. Still alternatively, it is all right if the source electrode and the drain electrode are separately formed on the substrate, the π-conjugated polymer film or the LB film is formed thereon, the insulating film is interposed between them and then the gate electrode is formed.

Although the acid giving film 13 is formed on the π-conjugated polymer film 4 serving as the semiconductor layer in FIG. 3, it is all right if the gate electrode 2 is formed on the substrate 1, the insulating film 3 is interposed between them, the source electrode 5 and the drain electrode 6 are formed thereon, the acid giving film 13 is formed thereon and the π-conjugated polymer film 4 serving as the semiconductor layer is formed thereon. Alternatively, as shown in FIG. 4, it is all right if the gate electrode 2 is formed on the substrate 1, the acid giving layer 13 is formed thereon, the source electrode 5 and the drain electrode 6 are formed thereon and then the π-conjugated polymer film 4 serving as the semiconductor layer is formed thereon, in which the acid giving film 13 can serve also as the gate insulating film 3. Still alternatively, it is all right if the gate electrode 2 is formed on the substrate 1, the acid giving layer 13 serving also as the insulating film 3 is formed thereon, the π-conjugated polymer film 4 serving as the semiconductor layer is formed thereon and then the source electrode 5 and the drain electrode 6 are formed thereon.

Still alternatively, it is all right if the gate electrode 2 is formed on the substrate 1, the insulating film 3 is interposed between them, the π-conjugated polymer film 4 is formed thereon, the acid giving film 13 is formed thereon and then the source electrode 5 and the drain electrode 6 are formed thereon. Still alternatively, it is all right if the source electrode 5 and the drain electrode 6 are formed on the substrate 1, the π-conjugated polymer film 4 is formed thereon, the insulating film 3 serving also as the acid giving film 13 is interposed between them and then the gate electrode 2 is formed thereon.

Although the FET element part 11 and the liquid crystal display part 12 are formed on the same substrate in FIGS. 2 and 5, they can be formed on different substrates and then connected.

Although specific embodiments of the present invention will be described hereinafter, the present invention is not limited to these.

Embodiment 1

A 3-inch n type silicon plate having resistivity of 4 to 8 Ωcm was heated up in an oxygen flow and then covered with a silicon oxide film having a thickness of 3000 Å. Then, five pairs of gold electrodes with a thickness of 300 Å each having an under layer formed of chrome with 200 Å were formed on one side of the silicon oxide film by a usual vacuum deposition method, photolithography technique or etching technique. The five pairs of gold electrodes served as source and drain electrodes in an FET element. A width of the pair of gold electrodes, that is, a channel width was set at 2 mm and a distance between them, that is, a channel length was set at 6 microns. The thus formed substrate will be referred to as an FET element substrate hereinafter.

A temperature of the FET element substrate and a temperature of its atmosphere were set at approximately 60° C. and a precursor film was formed on the FET element substrate by the spin coating method using dimethylformamide (DMF) solution with approximately 2 wt % of a poly (2,5-thienylene vinylene) precursor having the following chemical structure, that is;

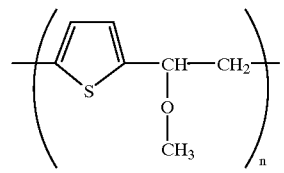

At this time, the number of revolution of a spinner was set at 2000/min. A film thickness of the precursor film was approximately 800 Å.

Then, the FET element substrate covered with a poly (2,5-thienylene vinylene) precursor film was heated up at 270° C. for two hours in nitrogen flow in an infrared image furnace. As a result, the color of the precursor film was changed from light yellow to brown. The-poly (2,5-thienylene vinylene) precursor film was changed to the poly (2,5-thienylene vinylene) film through the above heating treatment and accordingly absorption in accordance with

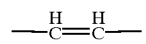

in 1590 cm$^{-1}$ occurred in an infrared absorption spectrum.

Then, the silicon oxide film on the other surface of the FET element substrate covered with the thus obtained film was mechanically peeled off and then an alloy of gallium and indium was attached to the uncovered silicon surface, whereby ohmic contact was made.

As a result, the silicon plate itself served as a common gate electrode of the five FET elements and the silicon oxide film on the silicon plate served as a common gate insulating film of the five FET elements. Thus, the FET element shown in FIG. 1 was provided. In addition, reference numerals 1 and 2 designate the silicon plate serving as the substrate and also as the gate electrode, reference numeral 3 designates the silicon oxide film serving as the insulating film, reference numeral 4 designates the poly (2,5-thienylene vinylene) film obtained from the poly (2,5-thienylene vinylene) precursor film serving as the semiconductor layer and reference numerals 5 and 6 designate gold films serving as the source and drain electrodes, respectively.

Embodiment 2

The FET element substrate made in accordance with the embodiment 1 was used. A temperature of a subphase (water) was set as 20° C. and an LB film of a precursor was formed on the FET element substrate by a vertical dipping method using a Kuhn type trough using a solution mixed with 0.5 ml of dimethylformamide (DMF) solution with approximately 2 wt % of a poly (2,5-thienylene vinylene) precursor having the following chemical structure, that is:

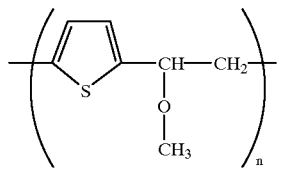

and 9.5 ml of chloroform as a spreading solution. At this time, a surface pressure π was set at 20 mN/m. The number of layers of the precursor LB film was 100.

Then, the FET element substrate covered with the LB film of the poly (2,5-thienylene vinylene) precursor was heated up at 210° C. for two hours in nitrogen flow in the infrared image furnace. As a result, the color of the precursor LB film was changed from light yellow to brown. The LB film of the poly (2,5-thienylene vinylene) precursor was changed to an LB film of poly (2,5-thienylene vinylene) through the above heating treatment and accordingly absorption in accordance with

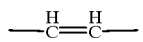

in 1590 cm$^{-1}$ occurred in the infrared absorption spectrum.

Then, the silicon oxide film on the other surface of the FET element substrate covered with the thus obtained LB film was mechanically peeled off and then an alloy of gallium and indium was applied to the uncovered silicon surface, whereby ohmic contact was made.

As a result, the silicon plate itself served as a common gate electrode of the five FET elements and the silicon oxide film on the silicon plate served as a common gate insulating film of the five FET elements. Thus, the FET element shown in FIG. 1 was provided. In addition, reference numerals 1 and 2 designate the silicon plate serving as the substrate and also as the gate electrode, reference numeral 3 designates the silicon oxide film serving as the insulating film, reference numeral 4 designates the LB film of poly (2,5-thienylene vinylene) obtained from the LB film of the poly (2,5-thienylene vinylene) precursor serving as the semiconductor layer and reference numerals 5 and 6 designate gold films serving as the source and drain electrodes, respectively.

Embodiment 3

Another example using heating treatment other than that of the embodiment 2 to provide the structure of the FET element shown in FIG. 1 will be shown hereinafter.

Similar to the embodiment 2, an LB film (100 layers) of poly (2,5-thienylene vinylene) was formed on the FET element substrate by the LB method. However, in this embodiment, a platinum electrode with a thickness of 300 Å having an under layer formed of chrome with a thickness of 200 Å was used instead of the gold electrode on the FET element substrate.

Then, the FET element substrate covered with the LB film of a poly (2,5-thienylene vinylene) precursor was heated up at 90° C. for one hour and a half in nitrogen flow containing hydrogen chloride gas flow in the infrared image furnace. As a result, the color of the precursor LB film was changed from light yellow to dark purple inclining to metallic luster. The LB film of the poly (2,5-thienylene vinylene) precursor was completely changed to the LB film of poly (2,5-thienylene vinylene) through the above heating treatment and accordingly absorption in accordance with

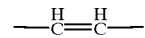

in 1590 cm$^{-1}$ occurred and absorption in accordance with

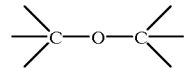

in 1099 cm$^{-1}$ disappeared in the infrared absorption spectrum.

Then, similar to the embodiment 2, the silicon plate itself served as a common gate electrode of the five FET elements and the silicon oxide film on the silicon plate served as a common gate insulating film of the five FET elements. Thus, the FET element of the structure shown in FIG. 1 was provided. In addition, reference numerals 1 and 2 designate the silicon plate serving as the substrate and also as the gate electrode, reference numeral 3 designates the silicon oxide film serving as the insulating film, reference numeral 4 designates the LB film of poly (2,5-thienylene vinylene) obtained from the LB film of the poly (2,5-thienylene vinylene) precursor serving as the semiconductor layer and reference numerals 5 and 6 designate platinum films serving as the source and drain electrodes, respectively.

Embodiment 4:

A temperature of the same FET element substrate as used in the embodiment 1 and its ambient temperature was set approximately 60° C. and a precursor film was formed on the FET element substrate by the spin casting method using dimethylformamide (DMF) solution with approximately 2 wt % of a poly (2,5-thienylene vinylene) precursor having the following chemical structure, that is:

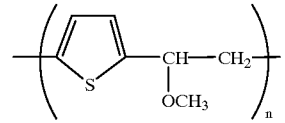

At this time, the number of revolution of the spinner was 2000/min. A thickness of the obtained precursor film was approximately 800 Å. Then, a solvent is evaporated to some degree and then a temperature of the FET element substrate and its ambient temperature was set at approximately 60° C. and a poly (p-phenylene vinylene) precursor film was formed on the poly (2,5-thienylene vinylene) precursor by the spin casting method using an aqueous solution with approximately 2 wt % of the poly (p-phenylene vinylene) precursor having the following chemical structure, that is:

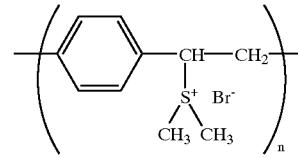

At this time, the number of revolution of the spinner was 2000/min. A film thickness of the obtained precursor film was 700 Å.

Then, the FET element substrate covered with two-layer films of the poly (2,5-thienylene vinylene) precursor film and the poly (p-phenylene vinylene) precursor films was heated up at 210° C. for two hours in nitrogen flow in the infrared image furnace. As a result, the color of the film was changed from light yellow to dark brown or dark purple. The laminated films comprising the poly (2,5-thienylene vinylene) precursor film and the poly (p-phenylene vinylene) precursor film was changed to laminated films comprising a poly (2,5-thienylene vinylene) film and poly (p-phenylene vinylene) through the above heating treatment and accordingly absorption in accordance with C=C of poly (2,5-thienylene vinylene) in 1590 $cm^{-1}$ and absorption in accordance with C=C of poly (p-phenylene vinylene) in 970 $cm^{-1}$ occurred, respectively in the infrared absorption spectrum. Meanwhile, no bad influence of corrosion or the like caused by acid was exerted to the element constructing pert formed of poly (2,5-thienylene vinylene) other than the semiconductor layer during a reaction of the heat treatment.

Then, the silicon oxide film on the other surface of the FET element substrate covered with the thus obtained film was mechanically peeled off and then an alloy of gallium and indium was applied to the uncovered silicon surface, whereby ohmic contact was made.

As a result, the silicon plate itself served as a common gate electrode of the five FET elements and the silicon oxide film on the silicon plate served as a common gate insulating film of the five FET elements. Thus, the FET element shown in FIG. 3 was provided. In addition, reference numerals 1 and 2 designate the silicon plate serving as the substrate and also as the gate electrode, reference numeral 3 designates the silicon oxide film serving as the insulating film, reference numeral 4 designates the poly (2,5-thienylene vinylene) film obtained from the poly (2,5-thienylene vinylene) precursor film serving as the semiconductor layer, reference numerals 5 and 6 designate gold films serving as the source and drain electrodes, respectively and reference numeral 13 designates the poly (p-phenylene vinylene) film obtained from the poly (p-phenylene vinylene) precursor film serving as the acid giving film.

Embodiment 5

An example of a method for manufacturing the liquid crystal display apparatus having the structure shown in FIG. 2 will be shown hereinafter. An n type silicon plate (25 mm×40 mm) having resistivity of 4 to 8 Ωcm and a thickness of 300 microns was oxidized by heat, whereby oxide films ($SiO_2$ films) having a thickness of approximately 900 Å were formed on both surfaces thereof. Similar to the embodiment 1, the gold electrodes (under layer chrome 200 Å and gold 300 Å) serving as the source electrode 5, the drain electrode 6 and the electrode 7 shown in FIG. 2 were formed on that surface. In addition, both the source electrode 5 and the drain electrode 6 had an effective area of 2 mm×4 mm and they were isolated by a width of 3 microns. More specifically, a channel width was 2 mm and a channel length was 3 microns in the FET element. In addition, the electrode 7 had an effective area of 17×19 $mm^2$ unit. This substrate is referred to as a liquid crystal display apparatus substrate hereinafter. Similar to the embodiment 1, a poly (2,5-thienylene vinylene) precursor film was formed on the liquid crystal apparatus substrate using a DMF solution with approximately 2 wt % of the poly (2,5-thienylene vinylene) precursor.

Then, the poly (2,5-thienylene vinylene) precursor film other than the FET element part of the liquid crystal display apparatus substrate was washed using chloroform. Thereafter, this substrate was heated up at 200° C. for approximately one hour in nitrogen flow containing approximately 1% of hydrogen chloride gas in the infrared image furnace. Thus, only the FET element part was covered with the poly (2,5-thienylene vinylene) film and the FET element part 11 in the liquid crystal display apparatus shown in FIG. 2 was completed.

Then, orientation processing was performed by diagonally depositing $SiO_2$ on the liquid crystal apparatus substrate and an oppositely arranged glass plate 10 having an ITO 9 formed thereon so that orientation of a liquid crystal occurred. Then, a polyester film with a thickness of 10 microns was interposed between the liquid crystal display substrate and the oppositely arranged glass plate 10 having the ITO 9 except for one part so that the liquid crystal display part may be an opening part and then its neighborhood was sealed with an epoxy resin also except for one part. Then, a guest and host liquid crystal (made by Merck company and its trade name; ZLI1841) was implanted from this unsealed part and then that part was sealed with the epoxy resin. Then, a polarizing plate was stuck to the glass plate 10 and then the liquid crystal display part 12 in the liquid crystal display apparatus was completed.

Finally, $SiO_2$ on the back surface of the liquid crystal display apparatus substrate was partially peeled off and an alloy of gallium and indium was applied thereto, whereby an ohmic contact was made. Then, a lead wire was attached thereto with silver paste, so that the liquid crystal display apparatus was completed.

Embodiment 6

Similar to the embodiment 1, an LB film (100 layers) of a poly (2,5-thienylene vinylene) precursor was formed on the liquid crystal display apparatus substrate using a solution mixed with 0.5 ml of the DMF solution with approximately 2wt % of the poly (2,5-thienylene vinylene) precursor and 9.5 ml of chloroform as a developer.

Then, the LB film of the poly (2,5-thienylene vinylene) precursor other than the FET element part of the liquid crystal display apparatus substrate was washed using chloroform and then this substrate was heated up at 90° C. for approximately one hour and a half in nitrogen flow containing approximately 1% of hydrogen chloride gas in the infrared image furnace. Thus, only the FET element part was covered with the LB film of poly (2,5-thienylene vinylene) and then the FET element part 11 in the liquid crystal display apparatus shown in FIG. 2 was completed.

Then, orientation processing was performed by diagonally depositing $SiO_2$ on the liquid crystal apparatus substrate and an oppositely arranged glass plate 10 having an ITO 9 so that orientation of a liquid crystal occurred. Then, a polyester film with a thickness of 10 microns was interposed between the liquid crystal display apparatus substrate and the oppositely arranged glass plate 10 having the ITO 9 except for one part so that the liquid crystal display part may be an opening part and then its neighborhood was sealed with an epoxy resin also except for one part. Then, the guest and host liquid crystal (made by Merck company and its trade name; ZLI1841) was implanted from this unsealed part and then that part was sealed with the epoxy resin. Then, a polarizing plate was stuck to the glass plate 10 and then the liquid crystal display part 12 in the liquid crystal display apparatus was completed.

Finally, $SiO_2$ on the back surface of the liquid crystal display apparatus substrate was partially peeled off and an alloy of gallium and indium was applied thereto, whereby an ohmic contact was made. Then, a lead wire was attached thereto with silver paste, so that the liquid crystal display apparatus was completed.

Embodiment 7

An example of a method for manufacturing the liquid crystal display apparatus having the structure shown in FIG. 5 will be shown hereinafter. Similar to the embodiment 4, a poly (2,5-thienylene vinylene) precursor film was formed on the liquid crystal apparatus substrate using a DMF solution with approximately 2 wt % of the poly (2,5-thienylene vinylene) precursor. Then, similar to the embodiment 4, a poly (p-phenylene vinylene) precursor film was formed on the poly (2,5-thienylene vinylene) precursor film using an aqueous solution with approximately 2 wt % of the poly (p-phenylene vinylene) precursor. The poly (2,5-thienylene vinylene) precursor and the poly (p-phenylene vinylene) precursor film other than the FET element part of the liquid crystal display apparatus substrate was washed using chloroform. Thereafter, this substrate was heated up at 200° C. for approximately one hour in nitrogen flow in the infrared image furnace. Thus, only the FET element part was covered with poly (2,5-thienylene vinylene) and poly (p-phenylene vinylene) and then the FET element part 11 in the liquid crystal display apparatus shown in FIG. 5 was completed. Then, the liquid crystal display part 12 in the liquid crystal display apparatus was completed by the same operation as in the embodiment 5. Then, similar to the embodiment 5, the liquid crystal display apparatus was completed.

Comparative Example

An element in a comparative example was manufactured in accordance with the above literature (Appl. Phys. Lett., Vol. 49, pp.1210, 1986). More specifically, a reaction solution was made by dissolving 0.15 g of 2,2'-dithiophene as a monomer and 0.55 g of tetraethylammonium perchlorate as an electrolyte in 75 ml of acetonitrile. Then, this solution was aerated by nitrogen gas with high impurity and then sufficiently deaerated. Then, the FET element substrate obtained in the embodiment 1 was dipped therein. Then, electrochemical polymerization was performed by applying a constant current (100 $\mu$A/cm$^2$) between opposite platinum electrodes (10 mm×20 mm) for 480 seconds using five pairs of gold electrodes on the FET element substrate as working electrodes, whereby a polythiophene film with a thickness of 1400 Å was formed on the five pairs of gold electrodes and the silicon oxide film in the vicinity thereof. Since a large amount of perchlorate ions were doped into the polythiophene film at the same time of the electrochemical polymerization, a potential of the five pairs of gold electrodes was set at 0V in regard to a saturated calmel electrode and dedoping was performed immediately after the electrochemical polymerization so that the polythiophene film may have electrical conductivity of a semiconductor level. The obtained FET element was washed with acetonitrile two times and then dried in a vacuum desiccator.

Next, characteristics of the devices obtained in accordance with the embodiments 1 to 7 and the comparative example will be described.

Figure 6:
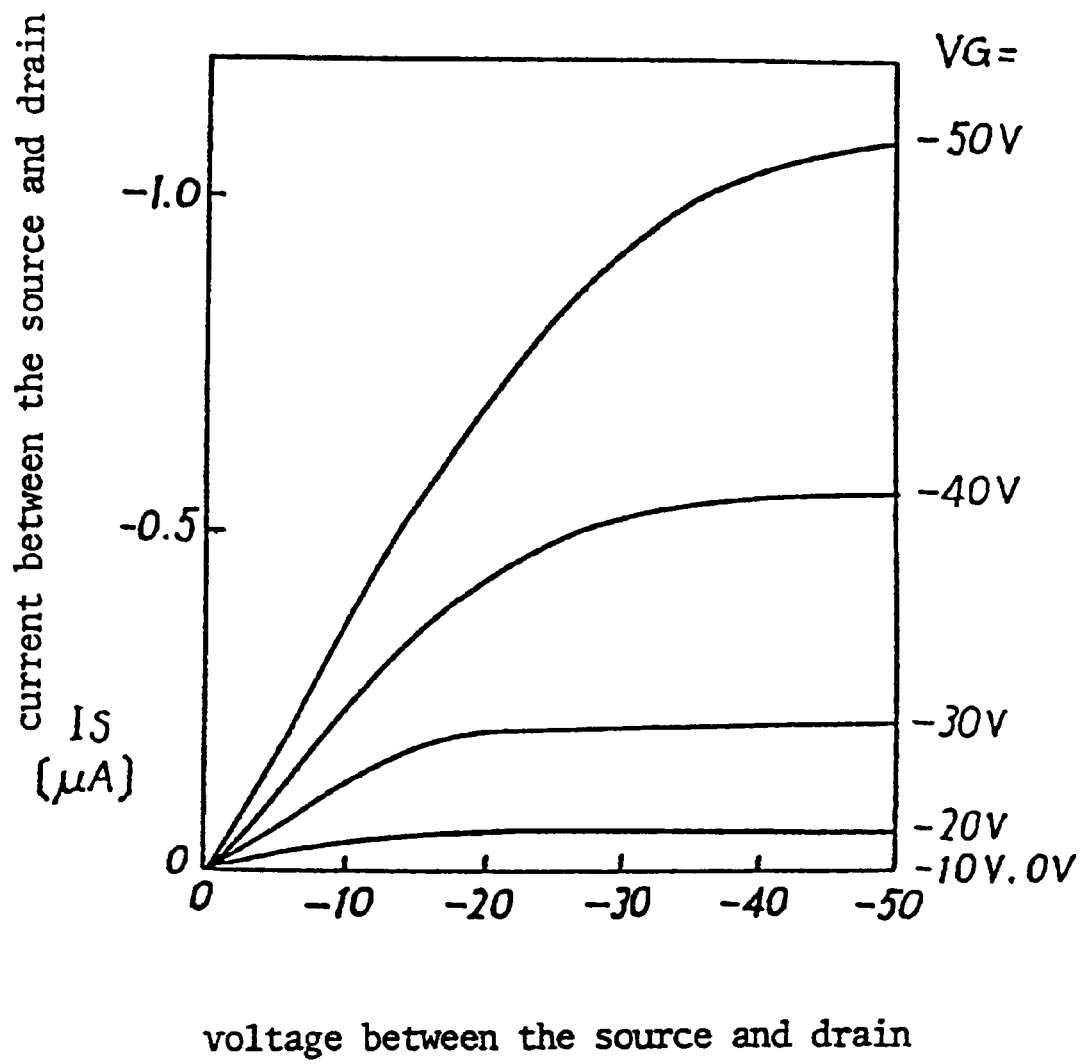
FIG. 6 is a graph showing characteristics of a current between a source and a drain and a voltage between the source and drain of an FET element in an embodiment 1 at each gate voltage.

First, FIG. 6 shows electrical characteristics of one FET element of five FET elements provided in accordance with the embodiment 1. Referring to this figure, the abscissa shows a voltage ($V_{DS}$) between the source and drain and the ordinate shows a current ($I_S$) between the source and drain. When a gate voltage ($V_G$) is at 0V, there is almost no $I_S$ even if the $V_{DS}$ is increased. However, when a negative $V_G$ is applied, the $I_S$ is increased. In addition, the $I_S$ is saturated when the $V_{DS}$ is large and then typical electrical characteristics of an enhancement type field effect transistor can be obtained. As can be seen from this figure, the current between the source and drain can largely vary with an applied gate voltage. Although FIG. 6 shows the characteristics of one element in the five FET elements, other FET elements show the same characteristics as that shown in FIG. 6. In addition, when their electrical characteristics are measured after these elements are left in the air for approximately one month, it is found that their characteristics are hardly changed and the elements obtained in accordance with this embodiment has high stability.

Figure 7:
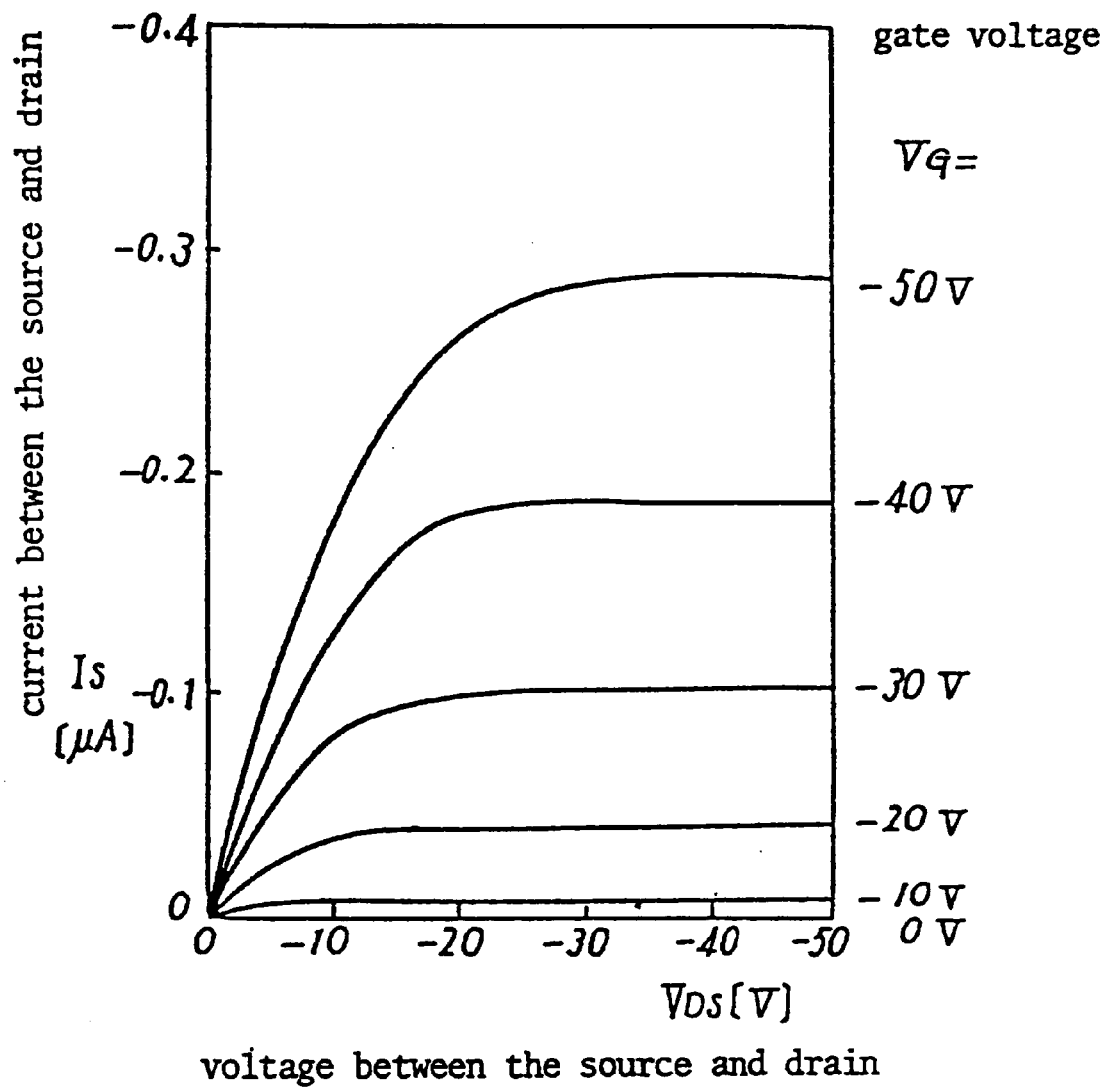
FIGS. 7, 8 and 9 are graphs showing characteristics of the same in an embodiment 2, an embodiment 3 and an embodiment 4, respectively.
Figure 8:
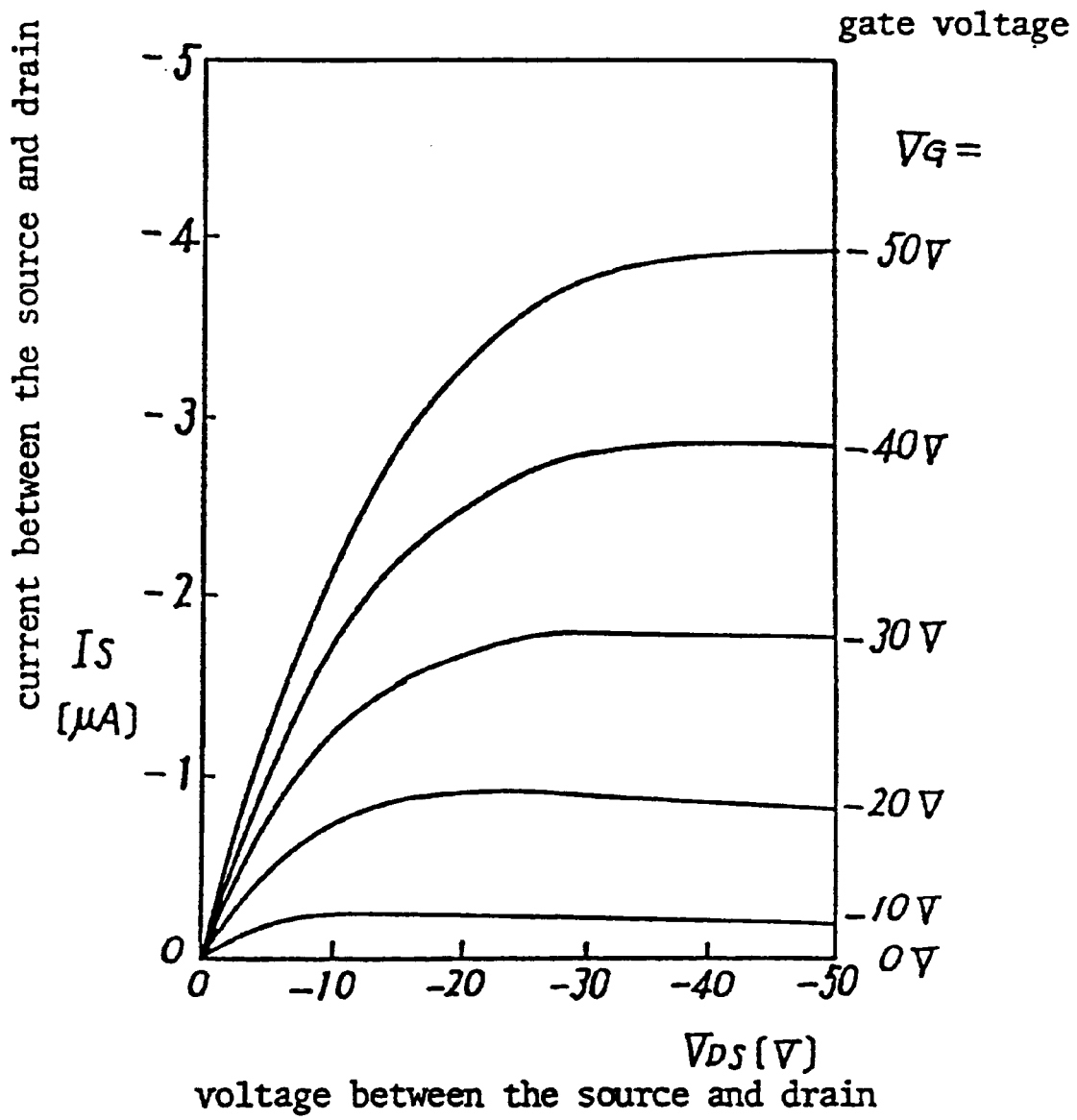

Next, FIGS. 7 and 8 show electrical characteristics of one FET element of five FET elements provided in accordance with the embodiment 2 and electrical characteristics of one FET element of five FET elements provided in accordance with the embodiment 3, respectively. Referring these figures, the abscissa shows a voltage ($V_{DS}$) between the source and drain and the ordinate shows a current ($I_S$) between the source and drain. When a gate voltage ($V_G$) is at 0V, there is almost no $I_S$ even if the $V_{DS}$ is increased. However, when a negative $V_G$ is applied, the $I_S$ is increased. In addition, the $I_S$ is saturated when the $V_{DS}$ is large and then typical electrical characteristics of an enhancement type field effect transistor can be obtained. As can be seen from these figures, the current between the source and drain can largely vary with an applied gate voltage. Although FIGS. 7 and 8 each show the characteristics of one element in the five FET elements in accordance with each embodiment, respective other FET elements show the same characteristics as that shown in FIGS. 7 and 8. In addition, when their electrical characteristic are measured after these elements are left in the air for approximately one month, it is found that their characteristics are hardly changed and the elements obtained in accordance with these embodiments has high stability.

Figure 9:
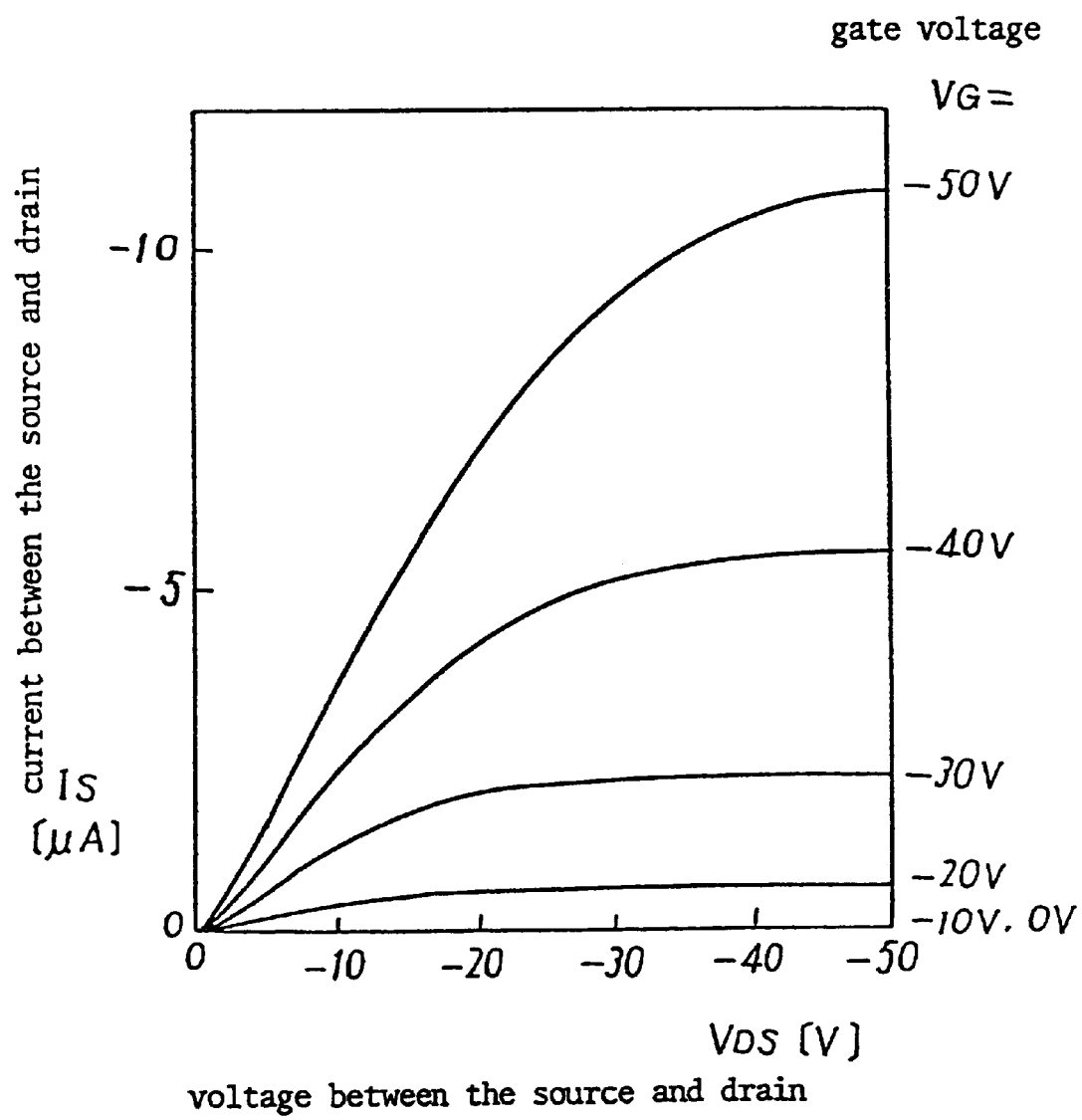

FIG. 9 shows electrical characteristics of one FET. element of five FET elements provided in accordance with the embodiment 4. Referring to this figure, the abscissa shows a voltage ($V_{DS}$) between the source and drain and the ordinate shows a current ($I_S$) between the source and drain. Similar to the embodiment 1, typical electrical characteristics of an enhancement type field effect transistor can be also obtained in this case. As can be seen from this figure, the current between the source and drain can largely vary with an applied gate voltage as compared with the embodiment 1 shown in FIG. 6.

Figure 10:
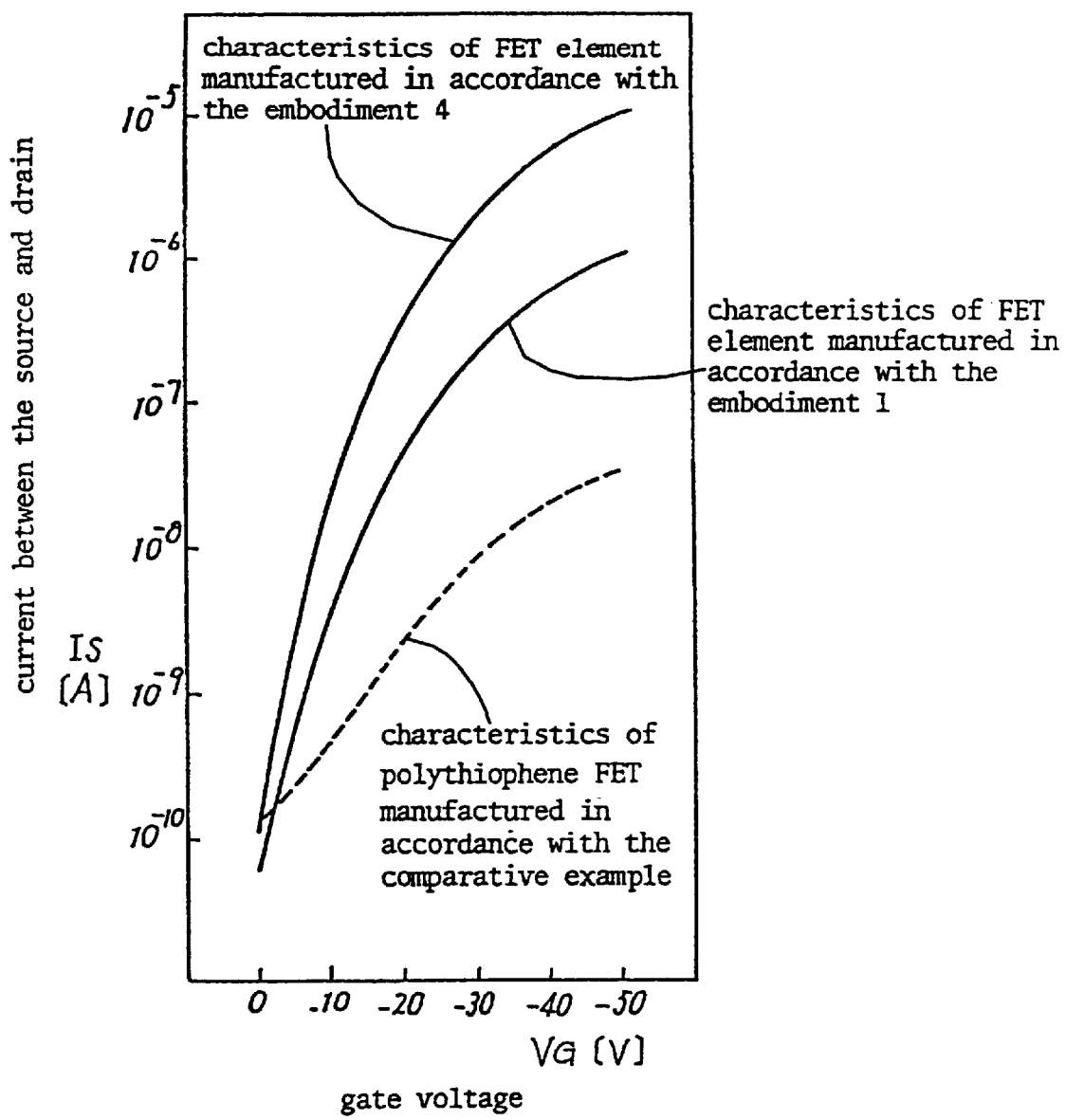
FIG. 10 is a graph showing characteristics of a current between the source and drain and a gate voltage of the FET elements in the embodiments 1 and 4 and the FET element in a comparative example in a state where a voltage between the source and drain of −50V is applied.

FIG. 10 shows characteristics of a current between the source and drain and a gate voltage of one FET element of the five FET elements manufactured in accordance with the embodiments 1 and 4 and the FET element manufactured in accordance with the comparative example under the condition that a voltage between the source and drain is constant (–50V). Referring to this figure, the abscissa shows a gate voltage ($V_G$) and the ordinate shows a current ($I_S$) between the source and drain. As can be seen from FIG. 10, the current between the source and drain capable of modulated by the gate voltage attains 4 figures or more in the FET element manufactured in accordance with the embodiment 1. In addition, a modulatable current between the source and drain attains 5 figures or more in the FET element manufactured in accordance with the embodiment 4. Meanwhile, a current between the source and drain capable of modulated by the gate voltage attains only 2 figures and a half in the conventional FET element in accordance with the comparative example. Thus, the characteristics of the FET elements in accordance with the embodiments 1 and 4 are highly improved as compared with the conventional FET element.

Figure 11:
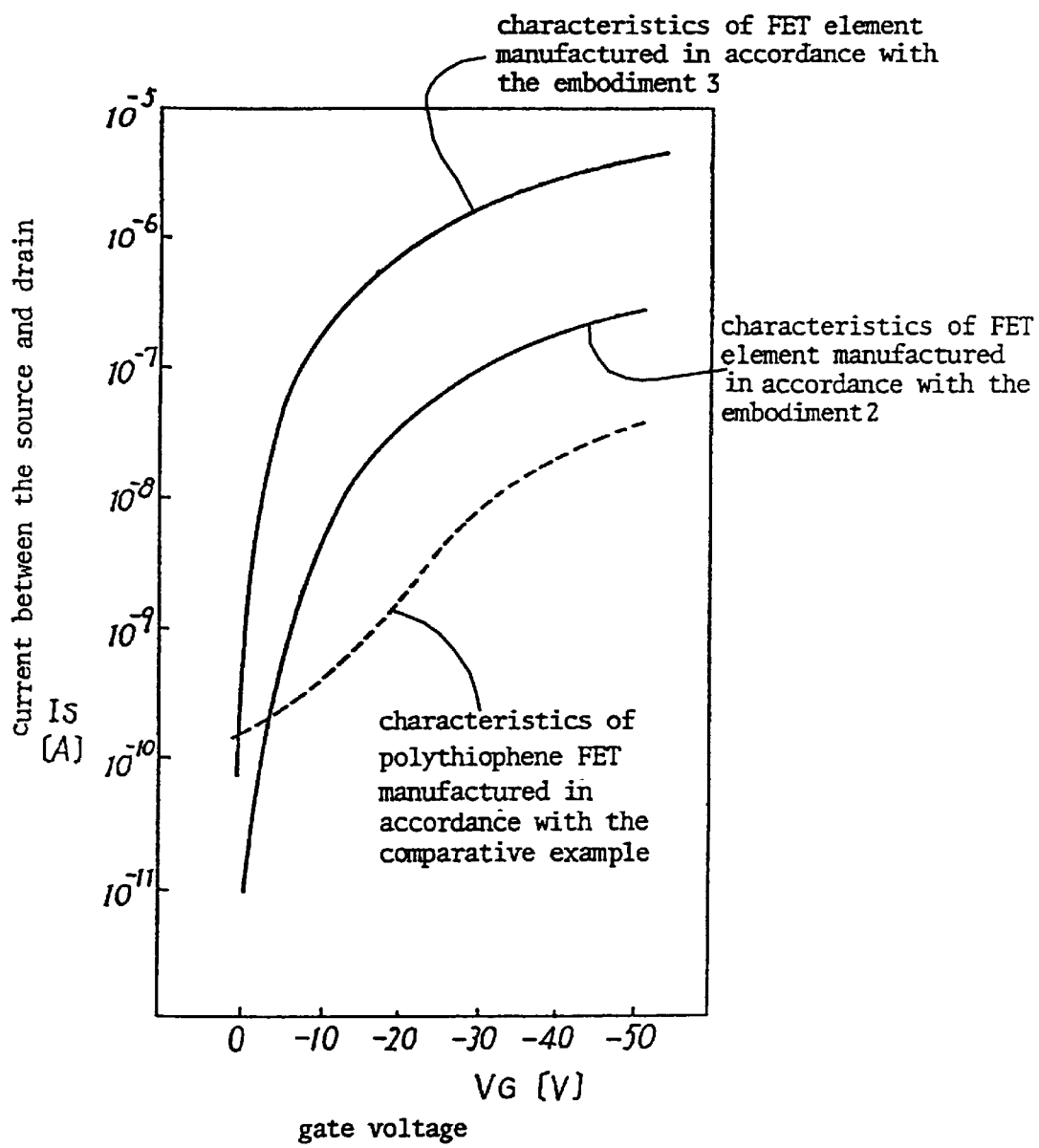
FIG. 11 is a graph showing characteristics of the same of the FET elements in the embodiments 2 and 3 and the FET element in the comparative example.

FIG. 11 shows characteristics of a current between the source and drain and a gate voltage of one FET element of the five FET elements manufactured in accordance with the embodiment 2, one FET element of the five FET elements manufactured in accordance with the embodiment 3 and the FET element manufactured in accordance with the comparative example under the condition that a voltage between the source and drain is constant (50V). Referring to this figure, the abscissa shows a gate voltage ($V_G$) and the ordinate shows a current ($I_S$) between the source and drain. As can be seen from FIG. 11, the current between the source and drain capable of modulated by the gate voltage attains 4 figures or more in the FET elements manufactured in accordance with the embodiments 2 and 3. Meanwhile, the current between the source and drain capable of modulated by the gate voltage attains only 2 figures and a half in the conventional FET element in accordance with the comparative example. Thus, the characteristics of the FET elements in accordance with the embodiments 2 and 3 are highly improved as compared with the conventional FET element.

Figure 12:
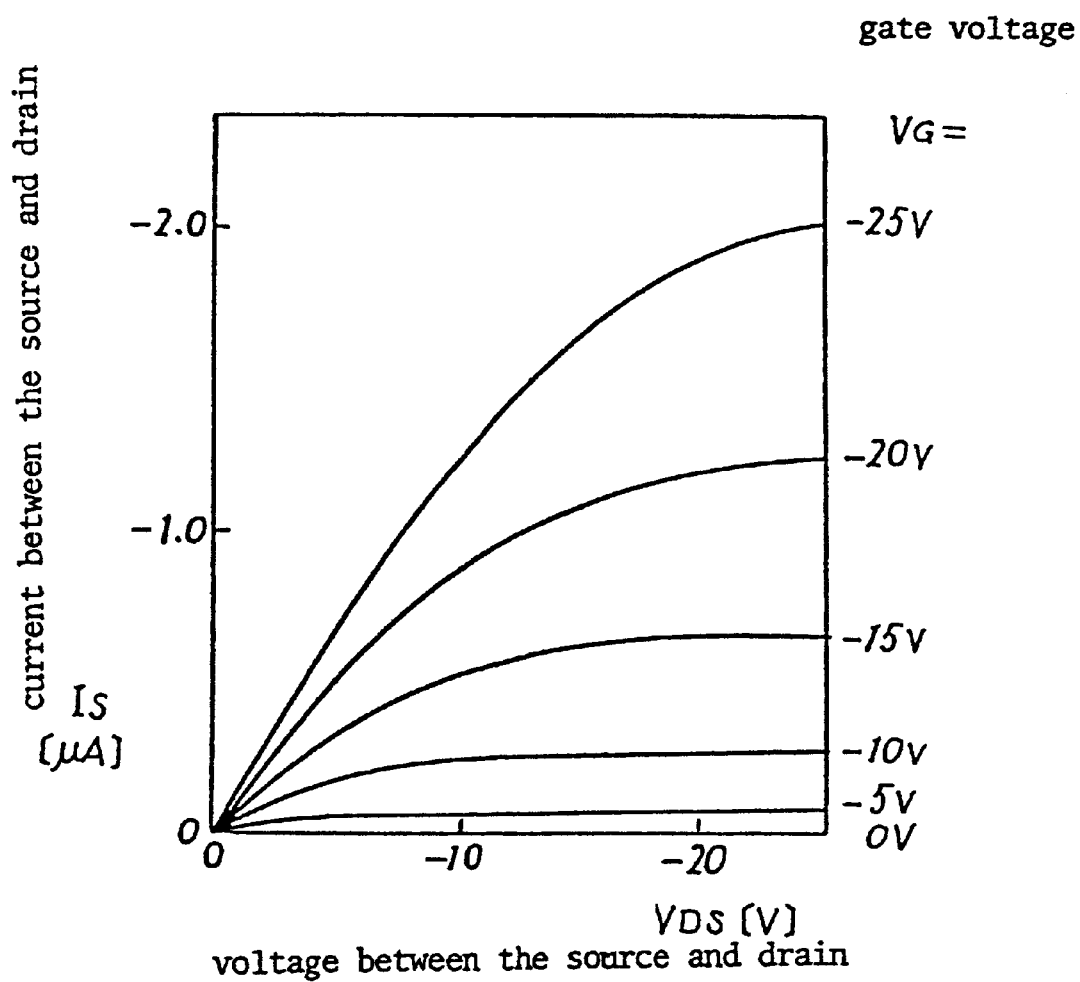
FIG. 12 is a graph showing characteristics of a current between the source and drain and a voltage between the source and drain of the FET element in a liquid crystal display apparatus in an embodiment 5 at each gate voltage.

FIG. 12 shows characteristics of a current between the source and drain and a voltage between the source and drain of the FET element in the liquid crystal display apparatus manufactured in accordance with the embodiment 5 when its gate voltage is varied. Referring to this figure, the abscissa shows a voltage ($V_{DS}$) between the source and drain and the ordinate shows a current ($I_S$) between the source and drain. In this figure, when the gate voltage of the FET element is at 0V, even if a voltage is applied between the source electrode and the drain electrode, there is almost no current between the source and drain. However, the more a negative gate voltage is applied, the more the current between the source and drain flows. Since the FET element is connected to the liquid crystal display part in series, when a negative voltage is applied to the gate electrode 2 while an enough voltage to drive the liquid crystal 8 is applied between the transparent electrode 9 on the glass plate 10 of the liquid crystal display part and the source electrode 5 of the FET element, a voltage is set applied to the liquid crystal display part and then the liquid crystal 8 is oriented so that the liquid crystal display part is driven. However, when the gate voltage is set at 0V, a voltage is not applied to the liquid crystal display part and then drive of the liquid crystal display part is stopped. More specifically, the drive of the liquid crystal can be controlled by the FET element in which the attached π-conjugated polymer film serves as the semiconductor layer. In addition, in view of stability, the liquid crystal display apparatus manufactured in accordance with this embodiment still stably operates after one month or more.

Figure 13:
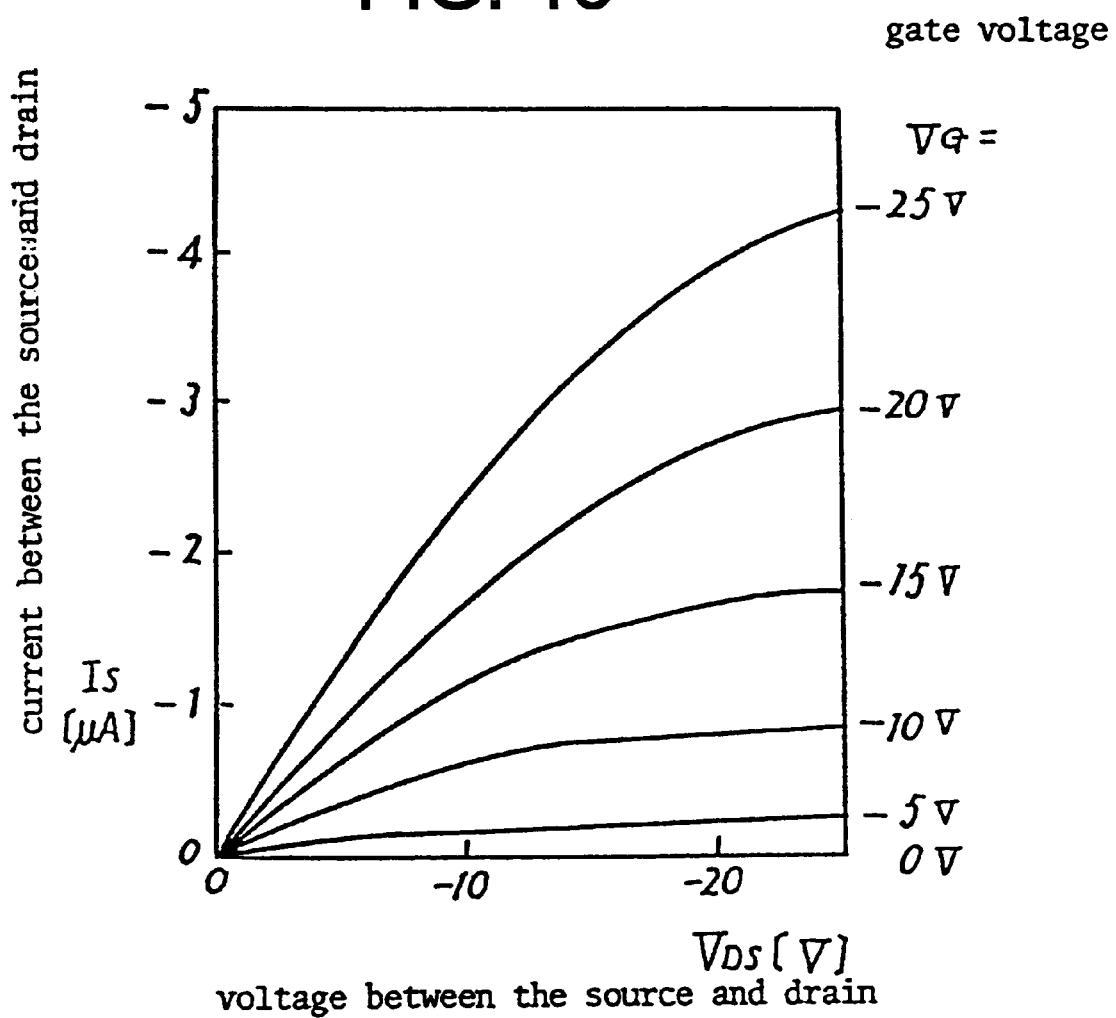
FIGS. 13 and 14 are graphs showing characteristics of the same in embodiments 6 and 7.

FIG. 13 shows characteristics of a current between the source and drain and a voltage between the source and drain when the gate voltage is varied of the FET element in the liquid crystal display apparatus manufactured in accordance with the embodiment 6. Referring to this figure, the abscissa shows a voltage ($V_{DS}$) between the source and drain and the ordinate shows a current ($I_S$) between the source and drain. In this figure, when the gate voltage of the FET element is at 0V, even if a voltage is applied between the source electrode and the drain electrode, there is almost no current between the source and drain. However, the more a negative gate voltage is applied, the more the current between the source and drain flows. Since the FET element is connected to the liquid crystal display part in series, when a negative voltage is applied to the gate electrode 2 while an enough voltage to drive the liquid crystal 8 is applied between the transparent electrode 9 on the glass plate 10 of the liquid crystal display part and the source electrode 5 of the FET element, a voltage is applied to the liquid crystal display part and then the liquid crystal 8 is oriented so that the liquid crystal display part is driven. However, when the gate voltage is at 0V, a voltage is not applied to the liquid crystal display part and then drive of the liquid crystal display part is stopped. More specifically, the drive of the liquid crystal can be controlled by the FET element in which the attached LB film of π-conjugated polymer serves as the semiconductor layer. In addition, in view of stability, the liquid crystal display apparatus manufactured in accordance with this embodiment still stably operates after one month or more.

Figure 14:
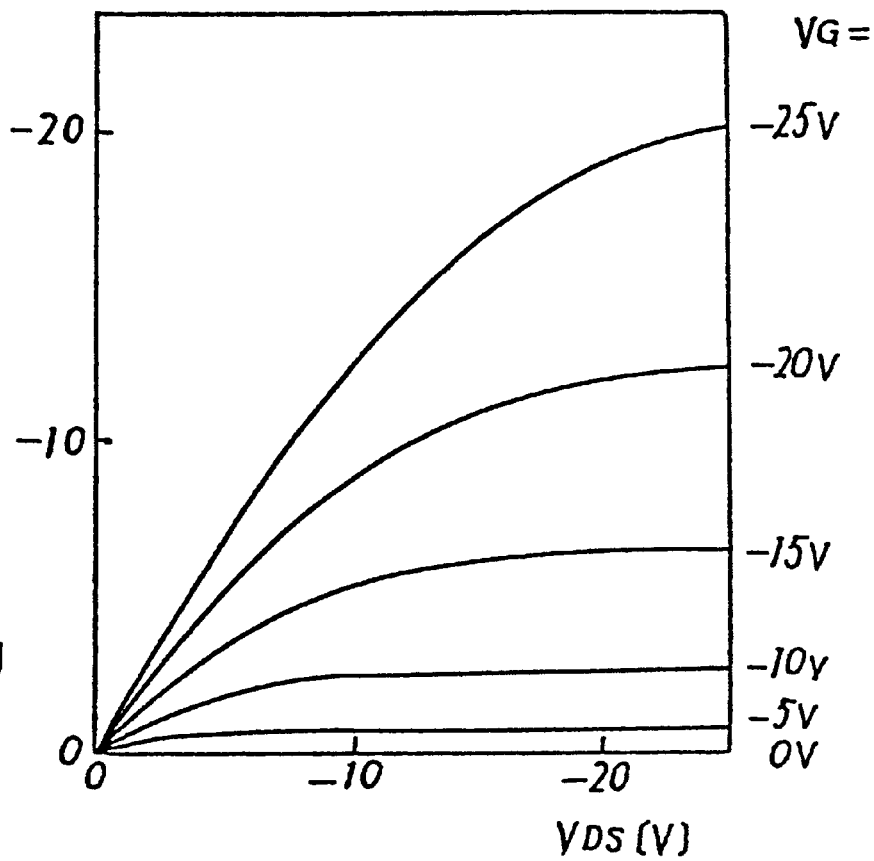
Figure 15:
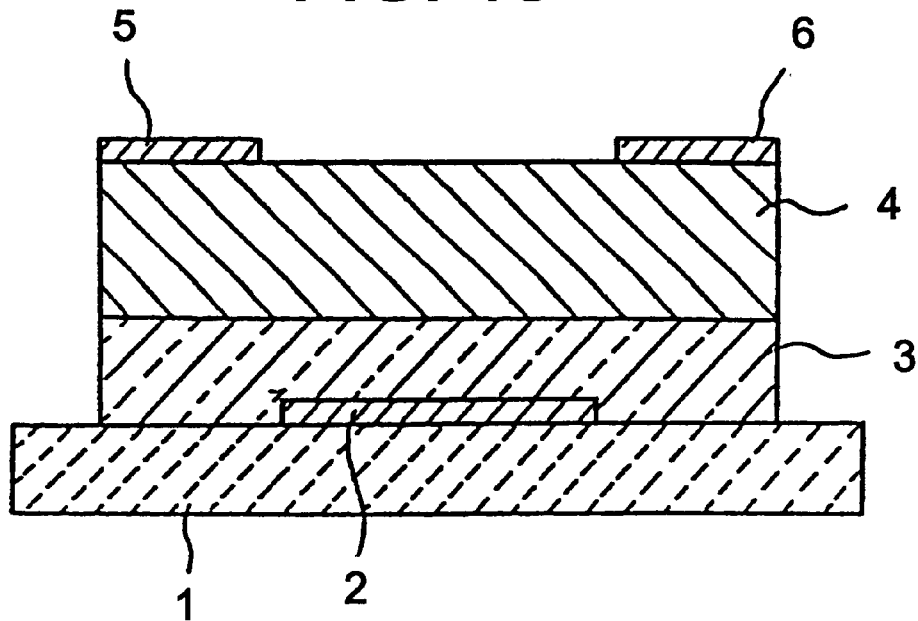
FIG. 15 is a sectional view showing a conventional FET element using polyacethylene as a semiconductor layer.
Figure 16:
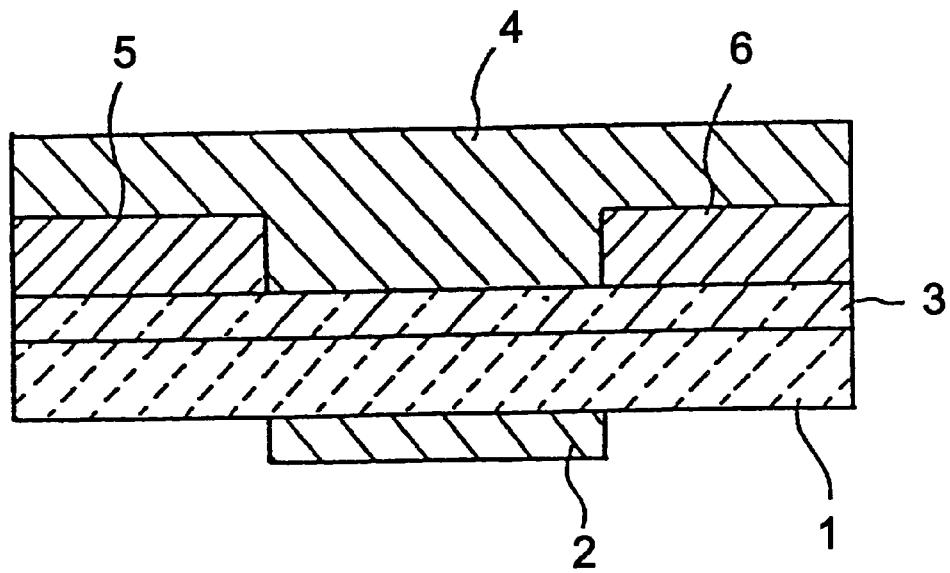
FIG. 16 is a sectional view showing a conventional FET element using poly (N-methylpyrrole) or polythiophene as a semiconductor layer.

FIG. 14 shows characteristics of a current between the source and drain and a voltage between the source and drain of the FET element in the liquid crystal display apparatus manufactured in accordance with the embodiment 7 when its gate voltage Is varied. Referring to this figure, the abscissa shows a voltage ($V_{DS}$) between the source and drain and the ordinate shows a current ($I_S$) between the source and drain. As can be seen from the figure, the current between the source and drain when the gate voltage is applied is larger than that of the embodiment 5 shown in FIG. 12, so that the characteristic is improved. In addition, similar to the embodiment 5, the drive of the liquid crystal can be controlled by the FET element. Furthermore, stability is also the same as in the embodiment 5.

Although the liquid crystal display apparatus is made by manufacturing one FET element and one liquid crystal display part in the embodiments 5 to 7, it is possible to make the liquid crystal display apparatus by manufacturing a plurality of FET elements and liquid crystal display parts. In this case, however, processing such as patterning using photoresist is necessary.

Industrial Applicability

As described above, the present invention relates to a field effect transistor using an organic semiconductor and a liquid crystal display apparatus using this transistor, which are applied to a field effect transistor or a liquid crystal display apparatus using the transistor as an driving element.

We claim:

1. A method of fabricating a liquid crystal display device including a field effect transistor comprising:

forming a gate electrode on an electrically insulating substrate, the gate electrode being located in a transistor region of the substrate;

forming an electrically insulating film on the substrate and covering the gate electrode;

forming source and drain electrodes on the electrically insulating film on opposite sides of the gate electrode in the transistor region;

forming a display electrode on the electrically insulating substrate in a display region of the substrate, adjacent the transistor region, the drain electrode being electrically connected to the display electrode;

forming, in the transistor region, a semiconductor film of a π-conjugated polymer having the chemical structure

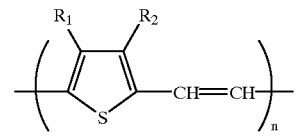

(where $R_1$ and $R_2$ are one of hydrogen, an alkyl group, and an alkoxy group, and n is an integer equal to at least 10), on the source and drain electrodes and on the electrically insulating film between the source and drain electrodes in the transistor region;

arranging a transparent plate, including a transparent electrode, opposite and spaced from the π-conjugated polymer film and the display electrode with the transparent electrode opposite the display electrode; and injecting a liquid crystal material between the transparent and display electrodes and between the transparent plate and the π-conjugated polymer film.

2. The method of claim 1 including forming the film of a π-conjugated polymer by heating a film of a precursor of the π-conjugated polymer, the precursor of the π-conjugated polymer having the chemical structure

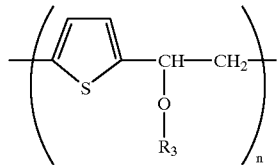

(where $R_3$ is a hydrocarbon group having 1 to 10 carbon atoms and n is an integer equal to at least 10).

3. The method of claim 2 wherein $R_3$ is $CH_3$ and the π-conjugated polymer is poly(2,5-thienylene vinylene).

4. The method of claim 2 wherein the precursor of the π-conjugated polymer includes an alkoxy group, the method including heating the precursor in an ambient including an inert gas.

5. The method of claim 4 including heating the precursor of the π-conjugated polymer to a temperature in a range of from 200 to 300° C. to produce the semiconductor film.

6. The method of claim 4 wherein the ambient includes a protonic acid vapor.

7. A method of fabricating a liquid crystal display device including a field effect transistor comprising:

forming a gate electrode on an electrically insulating substrate in a transistor region of the substrate;

forming an electrically insulating film on the substrate and covering the gate electrode;

forming, on the transistor region, a semiconductor film of a π-conjugated polymer having the chemical structure

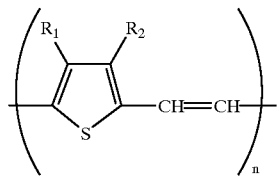

(where $R_1$ and $R_2$ are one of hydrogen, an alkyl group, and an alkoxy group, and n is an integer equal to at least 10), on the electrically insulating film in the transistor region;

forming source and drain electrodes on the semiconducting film on opposite sides of the gate electrode;

forming a display electrode on the electrically insulating substrate in a display region of the substrate, adjacent the transistor region, the display electrode being electrically connected to the drain electrode;

arranging a transparent plate, including a transparent electrode, opposite and spaced from the gate electrode and the display electrode with the transparent electrode opposite the display electrode; and injecting a liquid crystal material between the transparent and display electrodes and between the transparent plate and the π-conjugated polymer film.

8. The method of claim 7 including forming the film of a π-conjugated polymer by heating a film of a precursor of the π-conjugated polymer, the precursor of the π-conjugated polymer having the chemical structure

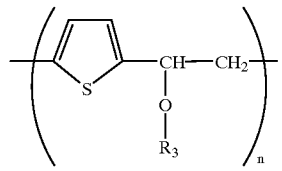

(where $R_3$ is a hydrocarbon group having 1 to 10 carbon atoms and n is an integer equal to at least 10).

9. The method of claim 7 wherein the precursor of the π-conjugated polymer includes an alkoxy group, the method including heating the precursor in an ambient including an inert gas.

10. The method of claim 8 wherein $R_3$ is $CH_3$ and the π-conjugated polymer is poly(2,5-thienylene vinylene).

11. The method of claim 9 including heating the precursor of the π-conjugated polymer to a temperature in a range of from 200 to 300° C. to produce the semiconductor film.

12. The method of claim 9 wherein the ambient includes a protonic acid vapor.

* * * * *